(12) United States Patent
Chen et al.

(10) Patent No.: US 12,707,753 B2
(45) **Date of Patent: *Aug. 11, 2026**

(54) PASSIVATED CONTACT STRUCTURE AND SOLAR CELL COMPRISING THE SAME, CELL ASSEMBLY, AND PHOTOVOLTAIC SYSTEM

(71) Applicant: Solarlab Aiko Europe GmbH, Freiburg (DE)

(72) Inventors: Gang Chen, Yiwu (CN); Wenli Xu, Yiwu (CN); Kaifu Qiu, Yiwu (CN); Yongqian Wang, Yiwu (CN); Xinqiang Yang, Yiwu (CN)

(73) Assignee: Solarlab Aiko Europe GmbH, Freiburg (DE)

(*) Notice: Subject to any disclaimer, the term of this patent is extended or adjusted under 35 U.S.C. 154(b) by 0 days.

This patent is subject to a terminal disclaimer.

(21) Appl. No.: 19/193,875

(22) Filed: Apr. 29, 2025

(65) Prior Publication Data

US 2025/0261473 A1 Aug. 14, 2025

Related U.S. Application Data

(63) Continuation of application No. 18/765,993, filed on Jul. 8, 2024, now Pat. No. 12,402,432, which is a (Continued)

(30) Foreign Application Priority Data

Jul. 22, 2021 (CN) ........................ 202110828475.X
Jul. 22, 2021 (CN) ........................ 202110828478.3

(51) Int. Cl.
*H10F 71/00* (2025.01)
*H10F 19/90* (2025.01)
*H10F 77/20* (2025.01)

(52) U.S. Cl.
CPC ......... *H10F 71/129* (2025.01); *H10F 19/908* (2025.01); *H10F 77/219* (2025.01)

(58) Field of Classification Search
CPC .... H10F 71/129; H10F 19/908; H10F 77/219; H10F 10/146; H10F 10/166
See application file for complete search history.

(56) References Cited

U.S. PATENT DOCUMENTS 9,312,406 B2 4/2016 Loscutoff et al.
2010/0108130 A1 5/2010 Ravi (Continued)

FOREIGN PATENT DOCUMENTS

CN 105609571 A 5/2016
CN 108649079 A 10/2018

(Continued)

OTHER PUBLICATIONS

The European Patent Office (EPO) The Extended European Search Report for 25190094.0 Nov. 11, 2025 7 Pages.

(Continued)

*Primary Examiner* — Kourtney R S Carlson
(74) *Attorney, Agent, or Firm* — ANOVA LAW GROUP, PLLC

(57) ABSTRACT

A solar cell includes a silicon substrate, a first doped region, and a second doped region. The first doped region includes a first passivated contact region on the silicon substrate and a second passivated contact region on the first passivated contact region. The first passivated contact region includes a first doped layer, a first passivation layer, and a second doped layer. The second passivated contact region includes a second passivation layer and a third doped layer. The second doped region includes a third passivation layer. Each of the first and third passivation layers includes a porous structure. One of the first and second doped regions is a (Continued)

P-type doped region, the other of the first and second doped regions is an N-type doped region, and a hole density of a corresponding passivation layer in the P-type doped region is greater than that in the N-type doped region.

17 Claims, 9 Drawing Sheets

Related U.S. Application Data continuation of application No. 18/657,783, filed on May 8, 2024, now Pat. No. 12,408,470, which is a continuation of application No. 17/862,359, filed on Jul. 11, 2022, now Pat. No. 12,211,950, which is a continuation-in-part of application No. 17/509,060, filed on Oct. 24, 2021, now Pat. No. 11,489,080.

(56) References Cited

U.S. PATENT DOCUMENTS

| | | | |
|---|---|---|---|
| 2010/0294349 | A1 | 11/2010 | Srinivasan et al. |
| 2013/0065350 | A1 | 3/2013 | Ravi |
| 2017/0179310 | A1 | 6/2017 | Westerberg et al. |
| 2018/0076341 | A1 | 3/2018 | Faur et al. |

FOREIGN PATENT DOCUMENTS

| | | | |
|---|---|---|---|
| CN | 108711579 | A | 10/2018 |
| CN | 109841693 | A | 6/2019 |
| CN | 109983584 | A | 7/2019 |
| CN | 110383502 | A | 10/2019 |
| CN | 111816727 | A | 10/2020 |
| CN | 112635592 | A | 4/2021 |
| CN | 113224202 | A | 8/2021 |
| CN | 215070001 | U | 12/2021 |
| EP | 3579284 | A1 | 12/2019 |
| EP | 3783668 | A1 | 2/2021 |
| EP | 4123723 | B1 | 4/2023 |
| EP | 4611506 | A3 | 12/2025 |
| EP | 4626183 | A3 | 12/2025 |
| GB | 2491209 | A | 11/2012 |
| JP | 2012527772 | A | 11/2012 |
| JP | 2014072293 | A | 4/2014 |
| JP | 2014515556 | A | 6/2014 |
| JP | 2015201666 | A | 11/2015 |
| JP | 2018050032 | A | 3/2018 |
| JP | 2018093168 | A | 6/2018 |
| JP | 2021061395 | A | 4/2021 |
| KR | 20160090287 | A | 7/2016 |
| KR | 20210053333 | A | 5/2021 |
| WO | 2018092189 | A1 | 5/2018 |

OTHER PUBLICATIONS

Felix Haase et al., "Laser contact openings for local poly-Si-metal contacts enabling 26.1%-efficient POLO-IBC solar cells", Solar Energy materials and Solar Cells (vol. 186), Nov. 2018, pp. 184-193.

The United States Patent and Trademark Office (USPTO) The office action for U.S. Appl. No. 18/765,184 Sep. 26, 2024 14 Pages.

The United States Patent and Trademark Office (USPTO) The office action for U.S. Appl. No. 18/765,184 Jan. 28, 2025 13 Pages.

The Japan Patent Office (JPO) Notification of Reasons for Refusal for Application No. 2022-097783 and Translation Sep. 13, 2022 10 Pages.

Puqun Wang et al., Development of TOPCon tunnel-IBC solar cells with screen-printed fire-through contacts by laser patterning, Solar Energy Materials and Solar Cells, Jan. 2021, pp. 1-8 of 110834, vol. 220, Elsevier, Amsterdam, Netherlands.

Jan Krugener et al., Improvement of the SRH bulk lifetime upon formation of n-type POLO junctions for 25% efficient Si solar cells, Solar Energy Materials and Solar Cells, May 2017, pp. 85-91 of 173 (2017), Elsevier, Amsterdam, Netherlands.

PASSIVATED CONTACT STRUCTURE AND SOLAR CELL COMPRISING THE SAME, CELL ASSEMBLY, AND PHOTOVOLTAIC SYSTEM

CROSS-REFERENCE TO RELATED APPLICATIONS

This application is a continuation of Ser. No. 18/765,993, filed on Jul. 8, 2024, which is a continuation of U.S. application Ser. No. 18/657,783, filed on May 8, 2024, which is a continuation of U.S. application Ser. No. 17/862,359, filed on Jul. 11, 2022, now issued as U.S. Pat. No. 12,211,950, which is a continuation-in-part of U.S. application Ser. No. 17/509,060, filed Oct. 24, 2021, now issued as U.S. Pat. No. 11,489,080, and which also claims the priority to Chinese Patent Application No. 202110828475.X filed Jul. 22, 2021, and Chinese Patent Application No. 202110828478.3 filed Jul. 22, 2021, the entire contents of all of which are incorporated herein by reference.

BACKGROUND

The disclosure relates to the technical field of solar cells, and in particular, to a passivated contact structure and a solar cell comprising the same, a cell assembly, and a photovoltaic system.

Electricity generated by solar cells is a sustainable clean energy source. By virtue of a photovoltaic effect of a semiconductor p-n junction, sunlight can be converted into electric energy. Conversion efficiency is an important indicator of the performance of solar cells. In an interdigitated back contact (IBC) cell, a positive/negative electrode is designed on a back side of the cell, so that a front surface is not at all shielded by a metal gate line or metal finger, thereby completely eradicating an optical loss caused by the shielding of the metal gate line or metal finger. In addition, a width of the electrode may be designed wider than a conventional electrode, so that a series resistance loss is reduced, thereby significantly improving the conversion efficiency. In addition, since the front side is designed with no electrodes, a product is more esthetically appealing, and is applicable to a plurality of application scenarios.

In a conventional IBC technology, an n region and a p region alternate to each other are required to be formed. However, high recombination may be caused by direct contact between the n region and the p region, resulting in reduction of a parallel resistance and conversion efficiency. In some technologies, a silicon substrate is exposed or a trench is provided between the n region and the p region for isolation. However, the isolation effect is poor. In addition, since the doping concentration of the p region and a gap region (a blank zone or a gap between the n region and the p region) is relatively low, the passivation effect is poor, and a surface is prone to pollution. In addition, in an IBC passivated contact cell, an electrode is directly printed in the P region or the N region. Therefore, during a subsequent sintering process, burn-through is easily caused, which causes the electrode to come into direct contact with a silicon substrate. As a result, recombination is increased, and the conversion efficiency is reduced.

In a conventional passivated IBC cell with doped polysilicon, the doped polysilicon is isolated from a silicon substrate by a tunneling layer, forming a passivated contact structure in a stacked form of doped polysilicon-tunneling layer (an insulation layer)-silicon substrate. The thickness of the tunneling layer has a very large impact on the tunneling resistance. In order to form a desirable resistivity, the thickness of the tunneling layer is required to be small enough. However, in order to realize a desirable passivation effect, the thickness of the tunneling layer should be large enough. Therefore, the thickness range of the tunneling layer must be strictly controlled. During production, the accuracy of the thickness of the tunneling layer is difficult to control. Therefore, production cannot be scaled up. In addition, requirements are also imposed for a thermal process in a follow-up production process. Therefore, the conversion efficiency of the cell is limited.

In another conventional passivated IBC cell doped with polysilicon, the doped polysilicon is isolated from a silicon substrate by using a tunneling layer, forming a passivated contact structure in a stacked form of doped polysilicon-tunneling layer (an insulation layer)-silicon substrate. In an existing IBC cell fabrication process, a plurality of processes such as polishing, doping, etching, coating, and screen printing are required. In addition, the IBC cell is required to be transported between a plurality of processes in a plurality of transportation manners such as a belt, a graphite boat, or a sucker.

However, during transport of the cell by using the belt, the cell is completely in contact with the belt. In this case, a rough surface on the belt may scratch the cell during the transmission. Although a scratch layer may be removed by using a subsequent texturing or etching process in an early fabrication process of the cell, after a passivation contact structure is fabricated for the cell, scratches caused by the belt to doped polysilicon in the passivation contact structure cannot be removed or require an additional process for removal. If the scratches on the cell are not removed, defects of the cell caused by the scratches still exist in subsequent processes of depositing a back passivation film and screen printing of an electrode, which affects conversion efficiency of the cell.

SUMMARY

Embodiments of the disclosure are intended to provide a passivated contact structure of a solar cell, to resolve problems of the poor isolation effect of a conventional conductive layer, the increased recombination and the reduced conversion efficiency caused by direct contact with a silicon substrate. Embodiments of the present invention are also intended to provide a back contact structure of a solar cell, to resolve scratches caused by belt transmission in an existing cell fabrication process.

The embodiments of the disclosure are implemented as follows. A passivated contact structure of a solar cell includes:

- a first passivated contact region, disposed on a silicon substrate, and a second passivated contact region, disposed on the first passivated contact region.

The second passivated contact region comprises an opening for connecting a conductive layer to the first passivated contact region.

The first passivated contact region includes a first doped layer, a first passivation layer, and a second doped layer, and the second passivated contact region includes a second passivation layer and a third doped layer.

Further, the first passivation layer is a porous structure comprising a hole region, and the first doped layer and/or the second doped layer are/is disposed in the hole region.

Further, the second doped layer and the third doped layer have opposite doping polarities.

Further, the first doped layer and the second doped layer have a same doping polarity.

Further, a pore size of the porous structure is less than 20 μm.

Further, the pore size of the porous structure is less than 10 μm.

Further, the pore size of the porous structure is less than 1000 nm. A hole is designed as a nano-level hole having a pore size less than 1000 nm, and a surface hole density may be designed up to $10^6$-$10^8$/cm$^2$. It may be understood that the arrangement of nano-level hole having the pore size less than 1000 nm greatly reduces the overall contact area between the second doped layer and the silicon substrate, thereby not only reducing the resistance, but also greatly reducing the recombination.

Further, a non-hole region of the porous structure includes a dopant having a same doping type as the first doped layer and/or the second doped layer.

Further, a part of the hole region of the porous structure includes the first doped layer and/or the second doped layer.

Further, a ratio of an area of the hole region of the porous structure to an entire area of the porous structure is less than 20%.

Further, a thickness of the second passivation layer is greater than a thickness of the first passivation layer.

Further, a thickness of the first passivation layer is in a range of 0.5-10 nm.

Further, the thickness of the first passivation layer is in a range of 0.8-2 nm.

Further, a thickness of the second passivation layer is in a range of 5-150 nm.

Further, the first passivation layer and/or the second passivation layer are/is an oxide layer, a silicon carbide layer, an amorphous silicon layer, or a combination thereof.

Further, the oxide layer comprises one or more of a silicon oxide layer and an aluminum oxide layer.

Further, the silicon carbide layer in the first passivation layer and/or in the second passivation layer includes a hydrogenated silicon carbide layer.

Further, a doping concentration of the first doped layer is between a doping concentration of the silicon substrate and a doping concentration of the second doped layer.

Further, a junction depth of the first doped layer is less than 1.5 μm.

Further, the first doped layer is a monocrystalline silicon doped layer doped with a group-III or group-V element.

Further, the second doped layer and/or the third doped layer include(s) a polysilicon doped layer, a silicon carbide doped layer, or an amorphous silicon doped layer.

Further, the silicon carbide doped layer in the second doped layer or the third doped layer comprises at least one silicon carbide doped film each having a different refractive index.

Further, the refractive indexes of the silicon carbide doped films decrease from the silicon substrate toward outside.

Further, the silicon carbide doped layer in the second doped layer and/or in the third doped layer includes a hydrogenated silicon carbide doped layer, a conductivity of the hydrogenated silicon carbide doped layer is greater than 0.01 S·cm, and a thickness of the hydrogenated silicon carbide doped layer is greater than 10 nm.

Another embodiment of the disclosure is intended to provide a solar cell. The solar cell includes:

- a silicon substrate;
- a first doped region and a second doped region, spaced apart on a back side of the silicon substrate and having opposite polarities;
- a first dielectric layer, disposed on a front side of the silicon substrate;
- a second dielectric layer, disposed between the first doped region and the second doped region; and
- a first conductive layer and a second conductive layer, respectively disposed in the first doped region and the second doped region.

The first doped region and/or the second doped region use(s) the passivated contact structure described above.

Further, one of the first doped region and the second doped region uses the passivated contact structure described above, and the other of the first doped region and the second doped region is disposed on a fourth doped layer in the silicon substrate.

Further, the fourth doped layer is a monocrystalline silicon doped layer doped with a group-III or group-V element.

Further, a third passivation layer and a fifth doped layer are disposed on the fourth doped layer in sequence.

Further, grooves spaced apart are provided on the back side of the silicon substrate, and the first doped region and the second doped region are alternately disposed in the grooves.

Further, grooves spaced apart are provided on the back side of the silicon substrate, one of the first doped region and the second doped region is disposed in one of the grooves, and the other of the first doped region and the second doped region is disposed outside the grooves.

Further, a trench is provided between the first doped region and the second doped region.

Further, the first doped region and the second doped region are disposed in a part of regions inside and outside the grooves.

Further, the first dielectric layer and the second dielectric layer each are an aluminum oxide layer, a silicon nitride layer, a silicon oxynitride layer, a silicon carbide layer, an amorphous silicon layer, a silicon oxide layer, or a combination thereof.

Further, the first dielectric layer and/or the second dielectric layer include(s) the aluminum oxide layer and the silicon carbide layer or the silicon oxide layer and silicon carbide layer; and

- a thickness of the first dielectric layer is greater than 50 nm, and a thickness of the second dielectric layer is greater than 25 nm.

Further, a thickness of the aluminum oxide layer or the silicon oxide layer in the first dielectric layer is less than 40 nm, a thickness of the aluminum oxide layer or the silicon oxide layer in the second dielectric layer is less than 25 nm, and a thickness of the silicon carbide layer in the first dielectric layer and/or in the second dielectric layer is greater than 10 nm.

Further, the silicon carbide layer in the first dielectric layer and/or in the second dielectric layer comprises at least one silicon carbide film.

Further, the refractive indexes of the silicon carbide films decrease from the silicon substrate toward outside.

Further, a magnesium fluoride layer is further disposed outside the first dielectric layer and/or the second dielectric layer.

Further, the first conductive layer and the second conductive layer are TCO transparent conductive films and/or metal electrodes.

Further, the metal electrodes each includes a silver electrode, a copper electrode, an aluminum electrode, a tin-coated copper electrode, or a silver-coated copper electrode.

Further, the copper electrode is electroplated copper prepared by using an electroplating process or the copper electrode prepared by means of physical vapor deposition.

Further, an electric field layer or a floating junction is further disposed between the front side of the silicon substrate and the second dielectric layer.

Further, one of the first doped region and the second doped region is a P-type doped region, the other of the first doped region and the second doped region is an N-type doped region, and a thickness of a first passivation layer in the P-type doped region is greater than a thickness of a first passivation layer in the N-type doped region.

Further, one of the first doped region and the second doped region is a P-type doped region, the other of the first doped region and the second doped region is an N-type doped region, and a hole density of a first passivation layer in the P-type doped region is greater than a hole density of a first passivation layer in the N-type doped region.

Another embodiment of the disclosure is intended to provide a solar cell. The solar cell includes:

a silicon substrate;

the passivated contact structure described above, disposed on a back side of the silicon substrate;

a third dielectric layer, disposed on the passivated contact structure;

a sixth doped layer and a fourth dielectric layer, disposed on a front side of the silicon substrate in sequence; and a third conductive layer and a fourth conductive layer, respectively electrically connected to the passivated contact structure and the sixth doped layer.

The passivated contact structure and the sixth doped layer have opposite polarities.

Another embodiment of the disclosure is intended to provide a cell assembly. The cell assembly includes one of the solar cells described above.

Another embodiment of the disclosure is intended to provide a photovoltaic system. The photovoltaic system includes the cell assembly described above.

Another embodiment of the disclosure is intended to provide a cell assembly. The cell assembly includes another of the solar cells described above.

Another embodiment of the disclosure is intended to provide a photovoltaic system. The photovoltaic system includes another of the cell assemblies described above.

According to the passivated contact structure of the solar cell provided in the embodiments of the disclosure, an opening is provided in the second passivated contact region, and the conductive layer penetrates the opening to be connected to the first passivated contact region, so that the conductive layer is disposed in the first passivated contact region. Therefore, the second passivated contact region surrounding the conductive layer can form isolating protection for the conductive layer, thereby forming isolation between an emitter and the conductive layer disposed on a back surface field in the cell prepared by using the passivated contact structure. In this way, the isolation effect is enhanced, and the recombination of a space-charge region is reduced. When no opening is provided in advance, the conductive layer may be directly printed on the second passivated contact region for sintering, to cause the conductive layer to pass through the second passivated contact region, so as to come into contact with the second doped layer of the first passivated contact region. In the prior art, when the conductive layer is printed on the second doped layer for sintering, the second doped layer and the passivation layer are easily burnt through, causing the conductive layer to come into direct contact with a silicon substrate, resulting in increased recombination and reduced conversion efficiency. By means of the embodiments of the disclosure, the above problems are resolved. In addition, the second passivated contact region further blocks pollutants, reducing a possibility of surface pollution. Moreover, the opening provided in the second passivated contact region may be used as an alignment reference during subsequent preparation of the conductive layer, so that the preparation of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. Hydrogen contained in the second doped layer and the third doped layer can diffuse inward in a high-temperature process, so that hydrogen passivation is enhanced. Therefore, the poor isolation effect of a conventional conductive layer, and the increased recombination and the reduced conversion efficiency caused by direct contact with a silicon substrate are resolved.

In addition, the embodiments of the present invention are implemented as follows. A back contact structure of a solar cell includes:

a first doped region having an opposite polarity to a silicon substrate and a second doped region having a same polarity as the silicon substrate, where the first doped region and the second doped region are spaced apart from each other on a back side of the silicon substrate, and a protective region is arranged on the first doped region;

each of the first doped region and the second doped region includes a first doped layer, a passivation layer, and a second doped layer;

the protective region includes an insulation layer and a third doped layer having a same polarity as the second doped region;

an isolation region is arranged between the first doped region and the second doped region;

an opening is provided in the protective region, to connect the first conductive layer to the first doped region; and a height of the first doped region and a height of the second doped region are both greater than a height of the isolation region.

Further, the height of the first doped region is greater than the height of the second doped region.

Further, the passivation layer is a porous structure having the first doped layer and/or the second doped layer in a hole region.

Further, one of the first doped region and the second doped region is a P-type doped region, the other of the first doped region and the second doped region is an N-type doped region, and a thickness of the passivation layer in the P-type doped region is greater than a thickness of the passivation layer in the N-type doped region.

Further, one of the first doped region and the second doped region is a P-type doped region, the other of the first doped region and the second doped region is an N-type doped region, and a hole density of the passivation layer in the P-type doped region is greater than a hole density of the passivation layer in the N-type doped region.

Further, the first doped layer and the second doped layer have a same doping polarity.

Further, a height difference between the first doped region and the second doped region is in a range of 1-8 μm.

Further, a height difference between the second doped region and the isolation region is in a range of 0.5-8 μm.

Further, a pore size of the porous structure is less than 20 μm.

Further, a ratio of an area of the hole region of the porous structure to an overall area of the porous structure is less than 20%.

Further, a thickness of the passivation layer is in a range of 0.5-10 nm.

Further, the passivation layer and/or the insulation layer are/is one or a combination of more than one of an oxide layer, a silicon carbide layer, or an amorphous silicon layer.

Further, a doping concentration of the first doped layer is between a doping concentration of the silicon substrate and a doping concentration of the second doped layer.

Further, a junction depth of the first doped layer is less than 1.5 μm.

Further, the first doped layer is a monocrystalline silicon doped layer doped with a group-III or group-V element.

Further, the second doped layer and/or the third doped layer include(s) a polysilicon doped layer, a silicon carbide doped layer, or an amorphous silicon doped layer.

Further, the silicon carbide doped layer in the second doped layer and/or the third doped layer is composed of at least one silicon carbide doped film each having a different refractive index, and the refractive indexes of the silicon carbide doped films sequentially decrease along a direction from the silicon substrate to the outside.

Further, the silicon carbide doped layer in the second doped layer and/or in the third doped layer includes a hydrogenated silicon carbide doped layer, a conductivity of the hydrogenated silicon carbide doped layer is greater than 0.01 S·cm, and a thickness of the hydrogenated silicon carbide doped layer is greater than 10 nm.

Further, a thickness of the insulation layer is in a range of 5-150 nm.

Further, a thickness of the insulation layer is greater than a thickness of the passivation layer.

Another embodiment of the present invention is intended to provide a solar cell. The solar cell includes:

- a silicon substrate;
- the back contact structure described above, arranged on a back side of the silicon substrate;
- a first dielectric layer, arranged on a front side of the silicon substrate;
- a first conductive layer arranged in the first doped region of the back contact structure and a second conductive layer arranged in the second doped region of the back contact structure; and
- a second dielectric layer, arranged on the back contact structure and between the first conductive layer and the second conductive layer.

Further, the first dielectric layer and the second dielectric layer each are one or a combination of more than one of an aluminum oxide layer, a silicon nitride layer, a silicon oxynitride layer, a silicon carbide layer, an amorphous silicon layer, or a silicon oxide layer.

Further, the first dielectric layer and/or the second dielectric layer include(s) the aluminum oxide layer and the silicon carbide layer or the silicon oxide layer and silicon carbide layer; and

- a thickness of the first dielectric layer is greater than 50 nm, and a thickness of the second dielectric layer is greater than 25 nm.

Further, a thickness of the aluminum oxide layer or the silicon oxide layer in the first dielectric layer is less than 40 nm, a thickness of the aluminum oxide layer or the silicon oxide layer in the second dielectric layer is less than 25 nm, and a thickness of the silicon carbide layer in the first dielectric layer and/or in the second dielectric layer is greater than 10 nm.

Further, the silicon carbide layer in the first dielectric layer and/or in the second dielectric layer is composed of at least one silicon carbide film each having a different refractive index, and the refractive indexes of the silicon carbide doped films sequentially decrease along a direction from the silicon substrate to the outside.

Further, a magnesium fluoride layer is further arranged on an outer layer of the first dielectric layer and/or the second dielectric layer.

Further, the first conductive layer and the second conductive layer are transparent conductive oxide (TCO) films and/or metal electrodes.

Further, the metal electrodes include a silver electrode, a copper electrode, an aluminum electrode, a tin-coated copper electrode, or a silver-coated copper electrode.

Further, an electric field layer or a floating junction is further arranged between the front side of the silicon substrate and the first dielectric layer.

Another embodiment of the present invention is intended to provides a photovoltaic module. The photovoltaic module includes the solar cell describe above.

Another embodiment of the present invention is intended to provide a photovoltaic system. The photovoltaic system includes the photovoltaic module described above.

According to the back contact structure of the solar cell provided in the embodiments of the present invention, the protective region is arranged on the first doped region and no processing is performed on the second doped region. In this way, a third doped layer in the protective region is arranged on an outermost layer to provide an anti-scratch effect, thereby preventing scratching of the first doped region on an inner side of the protective region. In addition, since the height of the second doped region is less than the height of the protective region, only the protective region comes into contact with a belt during transmission, and a gap exists between the second doped region and the belt, so that suspension is achieved, thereby preventing scratching of the second doped region during the belt transmission. Therefore, the scratches caused by the belt to the first doped region and the second doped region during the belt transmission are avoided. In this way, the scratches caused by the belt transmission in the existing cell fabrication process are resolved.

Since the passivation layer and the second doped layer in the second doped region and the insulation layer and the third doped layer in the protective region have similar structures and may be made of same materials, and the second doped layer in the second doped region has the same doping polarity as the third doped layer in the protective region, the second doped region and the protective region may be fabricated simultaneously by reusing the same process. Therefore, the protective region may be used as an intermediate generated in the fabrication process of the second doped region. The protective region is locally reserved by a patterned design, so that no additional process is required for generating the protective region, thereby reducing processes, a process time, and process costs. In addition, the opening is provided in the protective region, the first conductive layer is connected to the first doped region through the opening, and the first conductive layer is arranged on the first doped region. Therefore, the first doped region located at a periphery of the first conductive layer can form isolation and protection for the first conductive layer, thereby forming isolation between an emitter and the first conductive layer arranged on a back surface field in the cell fabricated by using the back contact structure. In this way, an isolation effect is enhanced, and recombination in a space-charge region is reduced. The protective region further blocks pollutants, thereby reducing a possibility of surface pollution. Moreover, the opening provided in the protective region may be used as an alignment reference during subsequent fabrication of the first conductive layer, so that the fabrication of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. In addition, since the isolation region is arranged between the first doped region and the second doped region, isolation between the first doped region and the second doped region can be realized, thereby preventing an undesirable phenomenon such as electric leakage caused by the connection between the first doped region and the second doped region without barriers. Since the passivation layer is designed as a porous structure, and the hole region has the first doped layer and/or the second doped layer embedded therein, a conductive channel is formed in the hole region of the passivation layer, so that a desirable resistivity of the passivation layer is formed. Therefore, the thickness of the passivation layer has less impact on a resistance. In this way, control requirements for the thickness of the passivation layer are lowered, and the method for fabricating a passivation layer is more flexible than the prior art. The first doped layer is arranged between the silicon substrate and the passivation layer to form a separation electric field capable of enhancing surface electron holes, so that the field passivation effect is enhanced. In addition, hydrogen included in the second doped layer and the third doped layer can diffuse inward in a high-temperature process, so that hydrogen passivation is enhanced.

DETAILED DESCRIPTION

Figure 1:
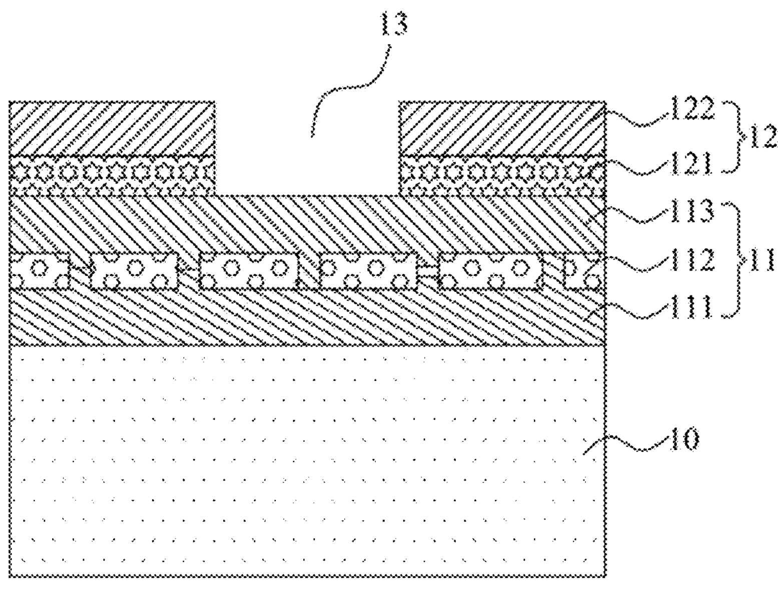
FIG. 1 is a schematic structural diagram of a passivated contact structure of a solar cell according to an embodiment of the disclosure.

To make the objectives, technical solutions and advantages of the disclosure clearer and more comprehensible, the disclosure is further described in detail below with reference to the accompanying drawings and embodiments. It is to be understood that the specific embodiments described herein are merely used to explain the disclosure, but are not intended to limit the disclosure.

In the disclosure, unless otherwise explicitly specified or defined, the terms such as “mount”, “install”, “connect”, “connection”, and “fix” should be understood in a broad sense. For example, the connection may be a fixed connection, a detachable connection, or an integral connection; or the connection may be a mechanical connection or an electrical connection; or the connection may be a direct connection, an indirect connection through an intermediary, or internal communication between two components. A person of ordinary skill in the art may understand specific meanings of the foregoing terms in the disclosure according to specific situations. The term “and/or” used in this specification includes any and all combinations of one or more related listed items.

According to the disclosure, an opening is provided in a second passivated contact region, and a conductive layer penetrates the opening to be connected to a first passivated contact region, so that the conductive layer is disposed in a first passivated contact region. Therefore, a second passivated contact region surrounding the conductive layer can form isolating protection for the conductive layer, thereby forming isolation between an emitter and the conductive layer disposed on a back surface field in a cell prepared by using the passivated contact structure. In this way, the isolation effect is enhanced, and the recombination of a space-charge region is reduced. When no opening is provided in advance, the conductive layer may be directly printed on the second passivated contact region for sintering, to cause the conductive layer to pass through the second passivated contact region, so as to come into contact with the second doped layer of the first passivated contact region. In the prior art, when the conductive layer is printed on the second doped layer for sintering, the second doped layer and the passivation layer are easily burnt through, causing the conductive layer to come into direct contact with a silicon substrate, resulting in increased recombination and reduced conversion efficiency. By means of the embodiments of the disclosure, the above problems are resolved. In addition, the second passivated contact region further blocks pollutants, reducing a possibility of surface pollution. Moreover, the opening provided in the second passivated contact region may be used as an alignment reference during subsequent preparation of the conductive layer, so that the preparation of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. Hydrogen contained in the second doped layer and the third doped layer can diffuse inward in a high-temperature process, so that hydrogen passivation is enhanced. Therefore, the poor isolation effect of a conventional conductive layer, and the increased recombination and the reduced conversion efficiency caused by direct contact with a silicon substrate are resolved.

Example 1

An embodiment of the disclosure provides a passivated contact structure of a solar cell. For ease of description, only parts related to this embodiment of the disclosure are shown. Referring to FIG. 1, the passivated contact structure of the solar cell provided in this embodiment of the disclosure includes:

a first passivated contact region 11 disposed on a silicon substrate 10 and a second passivated contact region 12 disposed on the first passivated contact region 11.

The second passivated contact region 12 comprises an opening 13 for a conductive layer to penetrate, so as to be connected to the first passivated contact region 11.

The first passivated contact region 11 includes a first doped layer 111, a first passivation layer 112, and a second doped layer 113, and the second passivated contact region 12 includes a second passivation layer 121 and a third doped layer 122.

In an embodiment of the disclosure, the silicon substrate 10 has a front side facing the sun during normal operation and a back side opposite to the front side. The front side is a light-receiving surface. The back side is opposite to the front side and disposed on another side of the silicon substrate 10. That is to say, the front side and the back side are located on different and opposite sides of the silicon substrate 10. In this embodiment, the silicon substrate 10 is an N-type monocrystalline silicon wafer. It may be understood that, in other embodiments, the silicon substrate 10 may also be silicon wafers of other types, such as a polysilicon wafer, a quasi-monocrystalline silicon wafer, or the like. The silicon substrate 10 may also be designed as a P-type. The silicon substrate 10 may be designed according to actual use requirements, which is not specifically limited herein.

In an embodiment of the disclosure, referring to FIG. 1, the passivated contact structure includes the first doped layer 111, the first passivation layer 112, the second doped layer 113, the second passivation layer 121, and the third doped layer 122 disposed on the silicon substrate 10 in sequence. The through opening 13 is provided on the second passivation layer 121 and the third doped layer 122, so that the conductive layer can penetrate the opening 13 to be connected to the second doped layer 113. It needs to be noted that, as shown in FIG. 1, the opening 13 is provided in the middles of the second passivation layer 121 and the third doped layer 122. Therefore, when the conductive layer penetrates the openings 13 to be connected to the second doped layer 113, the second passivation layer 121 and the third doped layer 122 surrounding the conductive layer can form isolating protection for the conductive layer. Thus, as shown in FIG. 2 to FIG. 11, in a cell prepared by using the passivated contact structure in this embodiment, since the second passivated contact region 12 surrounds the conductive layer, isolation can be formed between an emitter in the cell and the conductive layer disposed on a back surface field, so that a load in a space-charge region can be reduced. In addition, the second passivated contact region 12 further blocks pollutants, reducing a possibility of surface pollution. Moreover, the opening 13 provided in the second passivated contact region 12 may be used as an alignment reference during subsequent preparation of the conductive layer, so that the preparation of the conductive layer is more accurate.

In an embodiment of the disclosure, the first passivation layer 112 is preferably an oxide layer, a silicon carbide layer, an amorphous silicon layer, or a combination thereof. In some examples of the disclosure, the first passivation layer 112 may include a single material such as an oxide layer, a plurality of types of materials such as a combination of an oxide layer and an amorphous silicon layer, or a single material such as a combination of a plurality of amorphous silicon layers each having a different refractive index. In addition, the first passivation layer 112 may also be a silicon oxynitride layer, a silicon nitride layer, or the like. It may be understood that the specific structure of the first passivation layer 112 includes but is not limited to the above. The first passivation layer 112 may be correspondingly designed according to actual use requirements, which is not specifically limited herein. Further, a thickness of the first passivation layer 112 is in a range of 0.5-10 nm. In a preferable embodiment of the disclosure, the thickness of the first passivation layer 112 is in a range of 0.8-2 nm. The thickness of the first passivation layer 112 may be designed as a thickness of a tunneling layer in the prior art or a thickness larger than the thickness of the conventional tunneling layer. The thickness may be designed according to actual use requirements, which is not specifically limited herein.

In a preferable embodiment of the disclosure, specifically, the first passivation layer 112 includes the oxide layer and the silicon carbide layer. The oxide layer and the silicon carbide layer are arranged in sequence from the silicon substrate 10 toward outside. The oxide layer is in contact with the first doped layer 111 located inside, and the silicon carbide layer is in contact with the second doped layer 113 located outside. Further, the oxide layer preferably comprises one or more of a silicon oxide layer and an aluminum oxide layer. Therefore, the first passivation layer 112 may also be a combination of the silicon oxide layer and the aluminum oxide layer in the oxide layer. The silicon carbide layer in the first passivation layer 112 includes a hydrogenated silicon carbide layer. Hydrogen in the hydrogenated silicon carbide layer enters the silicon substrate 10 under a diffusion mechanism and a thermal effect, so that a dangling bond for neutralizing the back side of the silicon substrate 10 passivates defects of the silicon substrate 10. Therefore, mitigating dangling bonds in a forbidden band increases the probability that a carrier enters the second doped layer 113 through the first passivation layer 112.

Further, in an embodiment of the disclosure, as shown in FIG. 1, the first passivation layer 112 is a porous structure having the first doped layer 111 and/or second doped layer 113 in a hole region. In this case, the first passivation layer 112 is a porous structure. The porous structure may be prepared by means of additional chemical corrosion, dry etching, or thermal diffusion impact, or the like. The porous structure is performed according to actual use requirements, which is not specifically limited herein. It should be noted that, the porous structure is in a top view of the first passivation layer 112. In a cross-sectional view of the first passivation layer 112, a multi-channel structure is shown. The porous structure has holes extending through the first passivation layer 112. The porous structure also has grooves/notches not extending through the first passivation layer 112 on a surface of the first passivation layer 112. A pore size of the porous structure is less than 20 μm. Specifically, an average pore size of the holes is less than 20 μm, or pore sizes of 90% of all of the holes are less than 20 μm. Further, the pore size of the porous structure is less than 10 μm. Further, the pore size of the porous structure is less than 1000 nm. A hole is designed as a nano-level hole having a pore size less than 1000 nm, and a surface hole density may be designed up to $10^6$-$10^8$/cm$^2$. It may be understood that the arrangement of nano-level hole having the pore size less than 1000 nm greatly reduces the overall contact area between the second doped layer and the silicon substrate, thereby not only reducing the resistance, but also greatly reducing the recombination. A ratio of an area of the hole region of the porous structure to an entire area of the porous structure is less than 20%, that is, the holes are sparsely distributed on the first passivation layer 112.

In an embodiment of the disclosure, the hole region of the porous structure includes the first doped layer 111 and/or the second doped layer 113. That is to say, the hole region may be inlaid with the first doped layer 111 or the second doped layer 113 alone, or may be inlaid with a mixture of the first doped layer 111 and the second doped layer 113. It needs to be noted that, in an actual production and preparation process, a part of the hole region of the porous structure may include the first doped layer 111 and/or the second doped layer 113, and other parts that are not filled with the first doped layer 111 and/or the second doped layer 113 are gap regions. It needs to be further noted that, in addition to the first doped layer 111 and/or the second doped layer 113 filled in the hole region, impurities (such as hydrogen, oxygen, and various metal elements) formed in a thermal process (the production of solar cells may include a plurality of high temperature processes according to different processes) or generated during segregation are allowed to exist in the hole region. Since the first passivation layer 112 is designed as a porous structure, and the hole region has the first doped layer 111 and/or the second doped layer 113, a conductive channel is formed in the hole region of the first passivation layer 112, so that a desirable resistivity of the first passivation layer 112 is formed. In this way, the thickness of the first passivation layer 112 has a less impact on the resistance, and the control requirements for the thickness of the first passivation layer 112 are lowered. Thus, more methods are applicable to preparation of the first passivation layer 112 compared with the prior art. In the porous structure, the second doped layer 113 is connected to the silicon substrate 10 by using the doped hole region and the first doped layer 111, so that an overall resistance of the prepared cell is further reduced, and the conversion efficiency of the cell is improved.

Further, in an embodiment of the disclosure, a non-hole region of the porous structure includes a dopant having a same doping type as the first doped layer 111 and/or the second doped layer 113. For example, when the first doped layer 111 and the second doped layer 113 are N-type doped layers (such as a phosphorus doped layer), the non-hole region of the first passivation layer 112 includes a diffused N-type dopant.

In an embodiment of the disclosure, the first doped layer 111 is located between the silicon substrate 10 and the first passivation layer 112. The first doped layer 111 may be a doped layer directly formed on the silicon substrate 10 by means of ion implantation or the like. In this case, the first doped layer 111 is located on the silicon substrate 10. Correspondingly, the first passivation layer 112 is prepared on the first doped layer 111. The first doped layer 111 may also be a doped layer formed on the silicon substrate 10 after a doped source directly penetrates the first passivation layer 112 or the holes in the porous structure during preparation of the second doped layer 113. In this case, the first doped layer 111 is located in the silicon substrate 10. Correspondingly, the first passivation layer 112 is directly prepared on the silicon substrate 10. Therefore, during the preparation of the second doped layer 113, the first passivation layer is thermally diffused into the silicon substrate 10, so that a part of the silicon substrate 10 is transformed into the first doped layer 111 through diffusion. A doping concentration of the first doped layer 111 is between a doping concentration of the silicon substrate 10 and a doping concentration of the second doped layer 113. In a preferred embodiment of the disclosure, the first doped layer 111 and the second doped layer 113 have a same doping polarity. For example, when the second doped layer 113 is an N-type doped layer, the first doped layer 111 is correspondingly preferably an N-type doped layer. It needs to be noted that, the doping polarities of the first doped layer 111 and the second doped layer 113 may be different from a doping polarity of the silicon substrate 10. For example, in this embodiment, the silicon substrate 10 is an N-type monocrystalline silicon, and the first doped layer 111 and the second doped layer 113 may be P-type doped layers.

Preferably, a material of the first doped layer 111 is preferably designed as same as the silicon substrate 10. That is to say, when the silicon substrate 10 is a monocrystalline silicon wafer, the first doped layer 111 is also preferably designed as the monocrystalline silicon wafer. The first doped layer 111 is a monocrystalline silicon doped layer doped with a group-III or group-V element. When the second doped layer 113 is the N-type doped layer, the first doped layer 111 is a monocrystalline silicon doped layer doped with group-V elements such as nitrogen, phosphorus, and arsenic. When the second doped layer 113 is the P-type doped layer, the first doped layer 111 is a monocrystalline silicon doped layer doped with group-III elements such as boron, aluminum, and gallium. It may be understood that, when the silicon substrate 10 is designed as silicon wafers of other types, the first doped layer 111 may also be correspondingly designed as doped silicon wafers of other types doped with a group-III or group-V element.

Further, in an embodiment of the disclosure, the first doped layer 111 is in a discrete or continuous distribution. The first doped layer may be completely continuously disposed between the silicon substrate 10 and the first passivation layer 112, or locally discretely distributed near each hole region of the first passivation layer 112. The distribution of the first doped layer 111 may be controlled by using a doping process. A doping amount increases over a doping time, so that the first doped layer 111 is more continuous, until the first doped layer 111 fully covering the silicon substrate 10 is formed thereon. Further, a junction depth of the first doped layer 111 is less than 1.5 μm. The first doped layer 111 is disposed between the silicon substrate 10 and the first passivation layer 112 to form a separation electric field capable of enhancing surface electron holes, so that the field passivation effect is enhanced. Since a Fermi level of the first doped layer 111 is changed, a solid concentration of transition metal is increased to enhance impurity gettering, so that an additional impurity gettering effect is achieved.

In an embodiment of the disclosure, the second doped layer 113 includes a polysilicon doped layer, a silicon carbide doped layer, or an amorphous silicon doped layer. The silicon carbide doped layer in the second doped layer 113 comprises at least one silicon carbide doped film each having a different refractive index. The refractive indexes of the silicon carbide doped films decrease from the silicon substrate 10 toward the outside. It needs to be noted that, thicknesses and the refractive indexes of the silicon carbide doped films may be designed according to actual use requirements, provided that the refractive indexes decrease from the silicon substrate 10 toward the outside, which are not specifically limited herein. Since silicon carbide has a wide optical band gap and a low absorption coefficient, parasitic absorption can be reduced, and a short-circuit current density can be effectively increased. Further, the silicon carbide doped layer in the second doped layer 113 includes a hydrogenated silicon carbide doped layer. A conductivity of the hydrogenated silicon carbide doped layer is greater than 0.01 S·cm, and a thickness of the hydrogenated silicon carbide doped layer is greater than 10 nm. Correspondingly, the conductivity and the thickness may also be set to other values, provided that a requirement for the conductivity of the second doped layer 113 can be met by controlling the conductivity and the thickness of the hydrogenated silicon carbide doped layer, which are not specifically limited herein. It needs to be noted that, the first doped layer 111 and the second doped layer 113 may have a same material or different materials. For example, the first doped layer 111 and the second doped layer 113 both include doped polysilicon. Alternatively, the first doped layer 111 may include doped monocrystalline silicon, and the second doped layer 113 may include doped silicon carbide. The first doped layer and the second doped layer may be designed according to actual use requirements, which are not specifically limited herein.

In an embodiment of the disclosure, for details of the second passivation layer 121, refer to the above description of the first passivation layer 112. That is to say, the second passivation layer 121 is an oxide layer, a silicon carbide layer, an amorphous silicon layer, or a combination thereof. Specifically, the second passivation layer 121 preferably includes the oxide layer and the silicon carbide layer. The oxide layer and the silicon carbide layer are arranged in sequence from the silicon substrate 10 toward the outside. The oxide layer is in contact with the second doped layer 113 located inside, and the silicon carbide layer is in contact with the third doped layer 122 located outside. The silicon carbide layer in the second passivation layer 121 includes a hydrogenated silicon carbide layer. It needs to be noted that, the second passivation layer 121 is not the above porous structure. It needs to be further noted that, film layer structures in the first passivation layer 112 and the second passivation layer 121 may be designed same or differently. Thus, the first passivation layer 112 and/or the second passivation layer 121 are/is one or a combination of more of the oxide layer, the silicon carbide layer, and the amorphous silicon layer. For example, the first passivation layer 112 and the second passivation layer 121 both include the oxide layer and the silicon carbide layer. For another example, the first passivation layer 112 includes the oxide layer and the silicon carbide layer, and the second passivation layer 121 includes the aluminum oxide layer and the silicon carbide layer. The first passivation layer 112 and the second passivation layer 121 may be respectively designed according to actual use requirements, which are not specifically limited herein. Further, in this embodiment, a thickness of the second passivation layer 121 is in a range of 5-150 nm, and preferably, is greater than the thickness of the first passivation layer 112. The second passivation layer 121 may further include a dopant having a same doping type as the second doped layer 113 and/or the third doped layer 122.

In an embodiment of the disclosure, for details of the third doped layer 122, refer to the above description of the second doped layer 113, that is, the third doped layer 122 includes a polysilicon doped layer, a silicon carbide doped layer, or an amorphous silicon doped layer. The silicon carbide doped layer in the third doped layer 122 comprises at least one silicon carbide doped film each having a different refractive index. The refractive indexes of the silicon carbide doped films decrease from the silicon substrate 10 toward the outside. The silicon carbide doped layer in the third doped layer 122 includes a hydrogenated silicon carbide doped layer. A conductivity of the hydrogenated silicon carbide doped layer is greater than 0.01 S·cm, and a thickness of the hydrogenated silicon carbide doped layer is greater than 10 nm. Hydrogen contained in the second doped layer 113 and the third doped layer 122 can diffuse inward in a high-temperature process, so that hydrogen passivation is enhanced. It needs to be noted that, the second doped layer 113 and the third doped layer 122 may have a same material or different materials. Therefore, the second doped layer 113 and/or the third doped layer 122 include(s) the polysilicon doped layer, the silicon carbide doped layer, or the amorphous silicon doped layer. Preferably, the second doped layer 113 and the third doped layer 122 have opposite doping polarities. A Fermi level of the third doped layer 122 is changed, which increases an interface defect, so that heterogeneous nucleation points can be formed on the interface defect to enhance the impurity gettering effect. In this way, an additional impurity gettering effect is achieved.

In this embodiment, an opening is provided in the second passivated contact region, and the conductive layer penetrates the opening to be connected to the first passivated contact region, so that the conductive layer is disposed in the first passivated contact region. Therefore, the second passivated contact region surrounding the conductive layer can form isolating protection for the conductive layer, thereby forming isolation between an emitter and the conductive layer disposed on a back surface field in the cell prepared by using the passivated contact structure. In this way, the isolation effect is enhanced, and the recombination of a space-charge region is reduced. When no opening is provided in advance, the conductive layer may be directly printed on the second passivated contact region for sintering, to cause the conductive layer to pass through the second passivated contact region, so as to come into contact with the second doped layer of the first passivated contact region. In the prior art, when the conductive layer is printed on the second doped layer for sintering, the second doped layer and the passivation layer are easily burnt through, causing the conductive layer to come into direct contact with a silicon substrate, resulting in increased recombination and reduced conversion efficiency. By means of the embodiments of the disclosure, the above problems are resolved. In addition, the second passivated contact region further blocks pollutants, reducing a possibility of surface pollution. Moreover, the opening provided in the second passivated contact region may be used as an alignment reference during subsequent preparation of the conductive layer, so that the preparation of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. Hydrogen contained in the second doped layer and the third doped layer can diffuse inward in a high-temperature process, so that hydrogen passivation is enhanced. Therefore, the poor isolation effect of a conventional conductive layer, and the increased recombination and the reduced conversion efficiency caused by direct contact with a silicon substrate are resolved.

Example 2

A second embodiment of the disclosure provides a solar cell. For ease of description, only parts related to this embodiment of the disclosure are shown. Referring to FIG. 2 to FIG. 11, the solar cell provided in this embodiment of the disclosure includes:

- a silicon substrate 10;
- a first doped region 20 and a second doped region 30, spaced apart on a back side of the silicon substrate 10 and having opposite polarities;
- a first dielectric layer 40, disposed on a front side of the silicon substrate 10;

a second dielectric layer 50, disposed between the first doped region 20 and the second doped region 30; and a first conductive layer 60 and a second conductive layer 70, respectively disposed in the first doped region 20 and the second doped region 30.

The first doped region 20 and/or the second doped region 30 use(s) the passivated contact structure described in the above embodiments.

Figure 2:
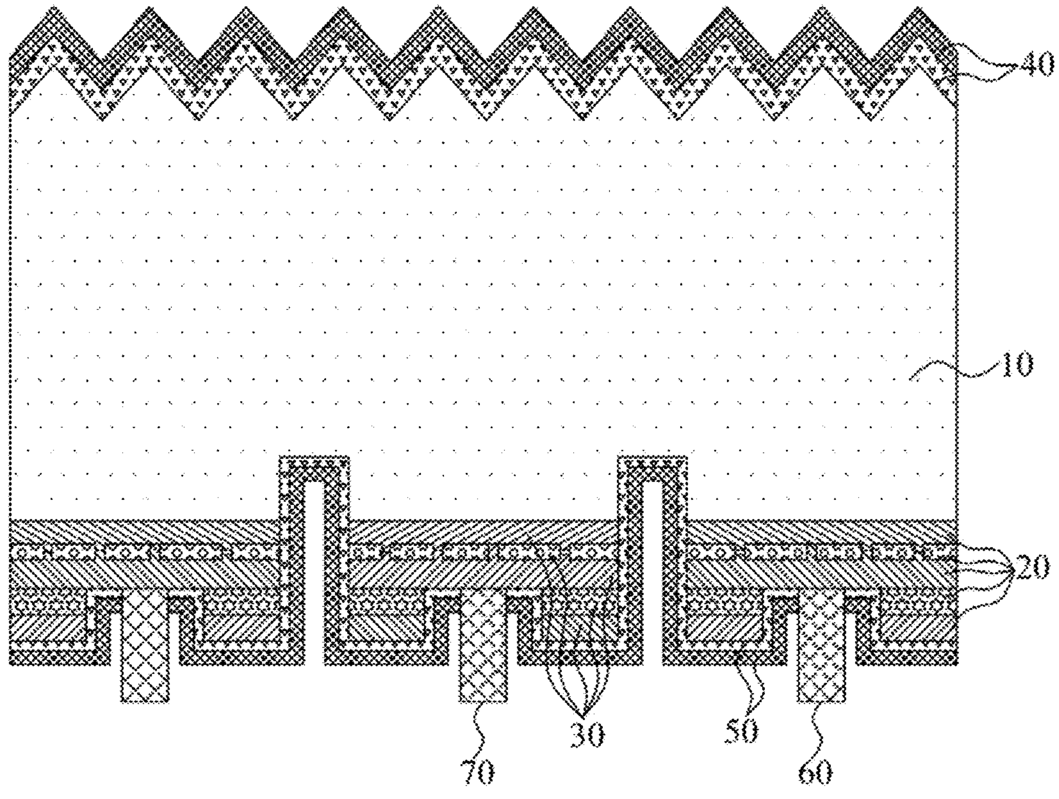
FIG. 2 to FIG. 11 are schematic structural diagrams of a solar cell during various implementation according to an embodiment of the disclosure.
Figure 5:
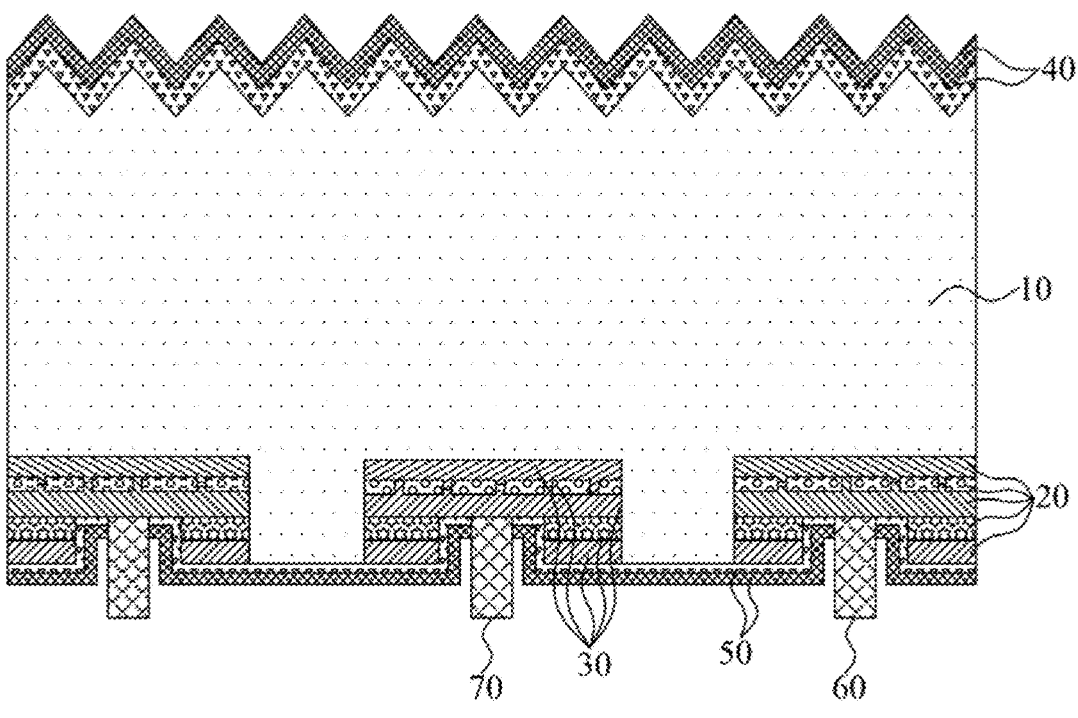
Figure 8:
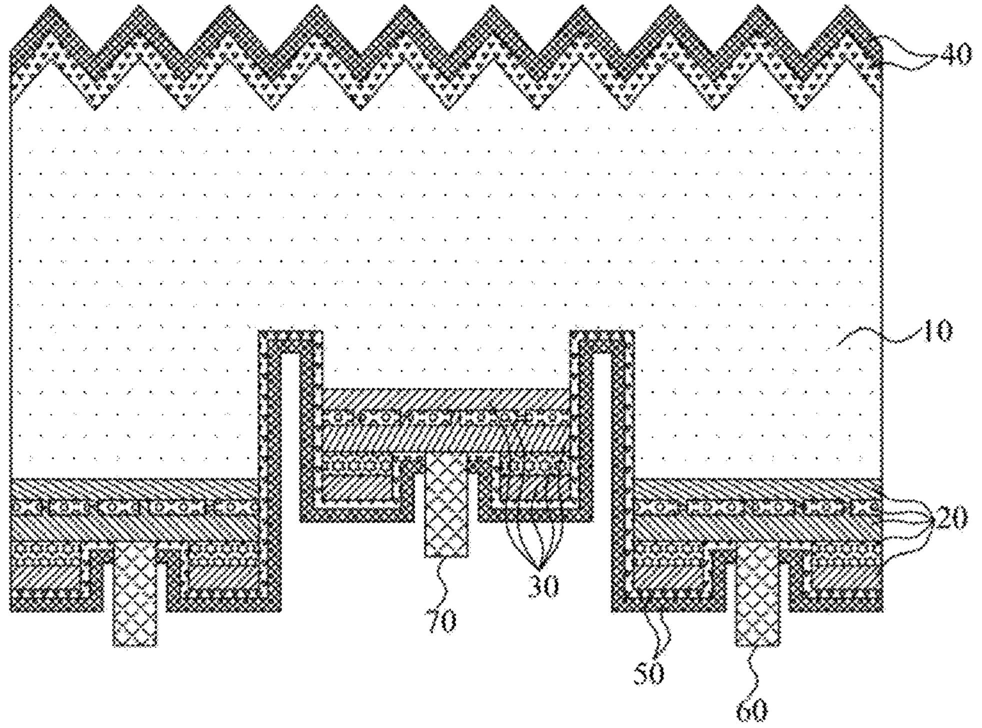

Thus, in an embodiment of the disclosure, the first doped region 20 and the second doped region 30 of the solar cell both may use the passivated contact structure described in the above embodiments, as shown in FIG. 2, FIG. 5, and FIG. 8. Since the first doped region 20 and the second doped region 30 have opposite polarities, a first doped layer and a second doped layer in the first doped region 20 and a first doped layer, a second doped layer, and a third doped layer in the second doped region 30 also have opposite polarities. For example, when the first doped layer and the second doped layer in the first doped region 20 are P-type doped layers, and the third doped layer is a P-type doped layer, the first doped layer and the second doped layer in the second doped region 30 are N-type doped layers having opposite polarities, and the third doped region is a P-type doped region having an opposite polarity. In this case, the first doped region 20 is a P-type doped region, and the second doped region 30 is an N-type doped region. Definitely, the first doped region 20 may also be the N-type doped region, and the second doped region 30 may also be the P-type doped region. Therefore, when one of the first doped region 20 and the second doped region 30 is the P-type doped region, the other of the first doped region and the second doped region is the N-type doped region.

Definitely, alternatively, one of the first doped region 20 and the second doped region 30 in the solar cell uses the passivated contact structure described in the above embodiments, and the other of the first doped region and the second doped region uses a conventional structure (such as a conventional passivated contact structure or a conventional diffusion structure). In a preferred embodiment of this embodiment, the other one is a fourth doped layer disposed in the back side of the silicon substrate 10. That is to say, the other one uses the conventional diffusion structure, as shown in FIG. 3, FIG. 6, FIG. 9, and FIG. 11. Definitely, optionally, the other one may also use the conventional passivated contact structure. The passivated contact structure includes a tunneling layer and a doped region. It needs to be noted that, the fourth doped layer is also a monocrystalline silicon doped layer doped with a group-III or group-V element. For a specific structure of the third doped layer, refer to the description of the first doped layer in the above embodiments. It needs to be further noted that, since the first doped region 20 and the second doped region 30 have opposite polarities, and the first doped layer and the second doped layer have the same doping polarity, the first doped layer and the fourth doped layer are doped with elements of different groups. That is to say, when the first doped layer is doped with a group-III element, the fourth doped layer is doped with a group-V element. When the first doped layer is doped with a group-V element, the fourth doped layer is doped with a group-III element.

Figure 4:
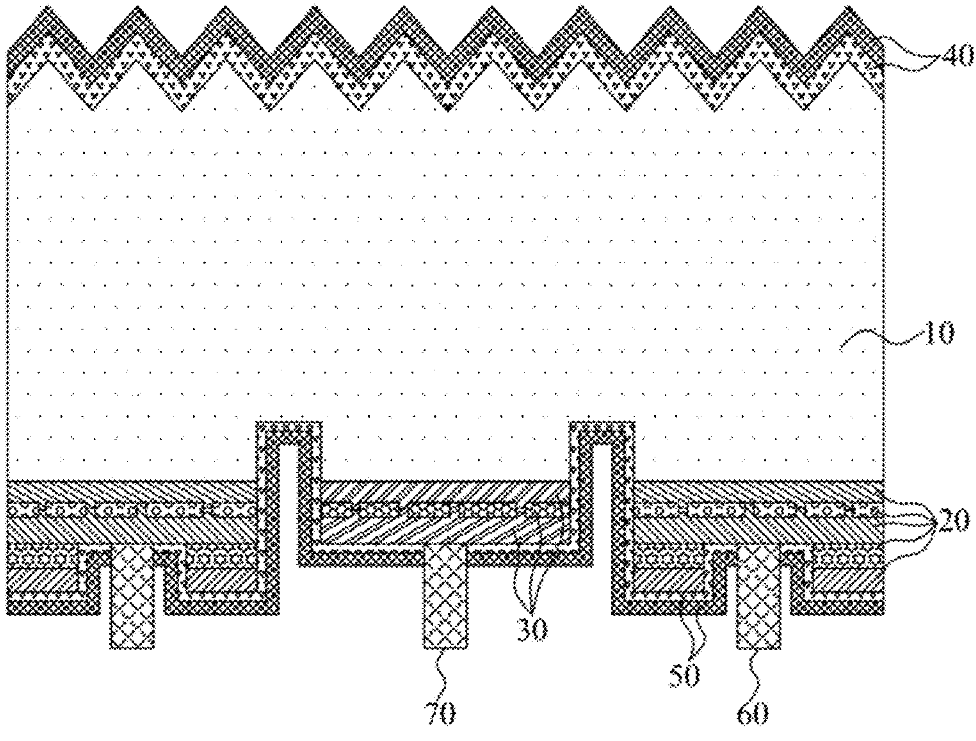
Figure 7:
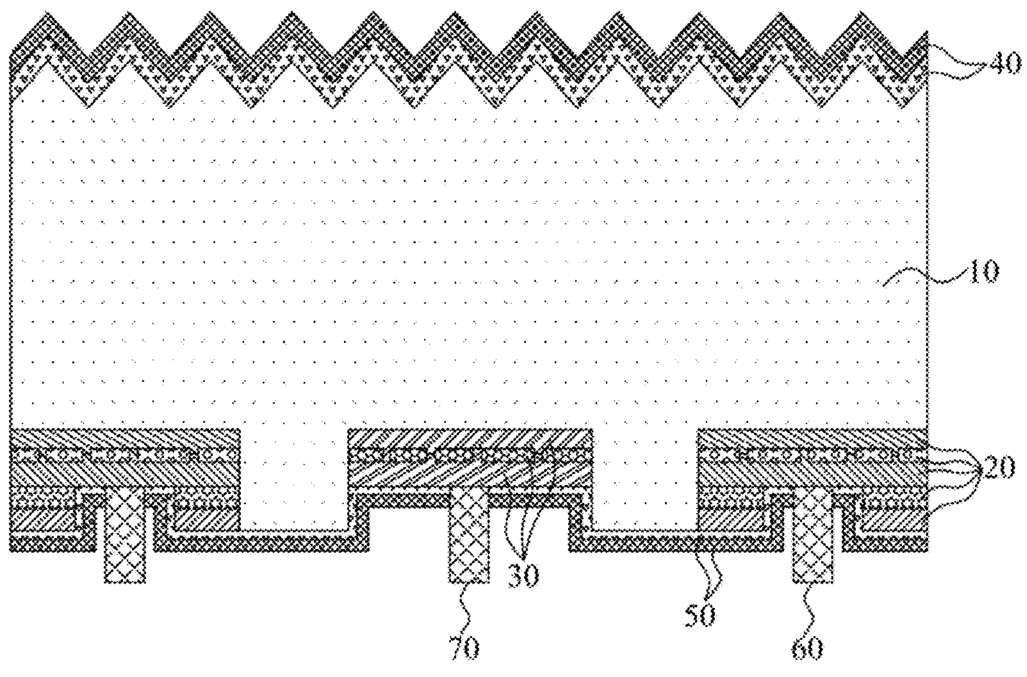
Figure 10:
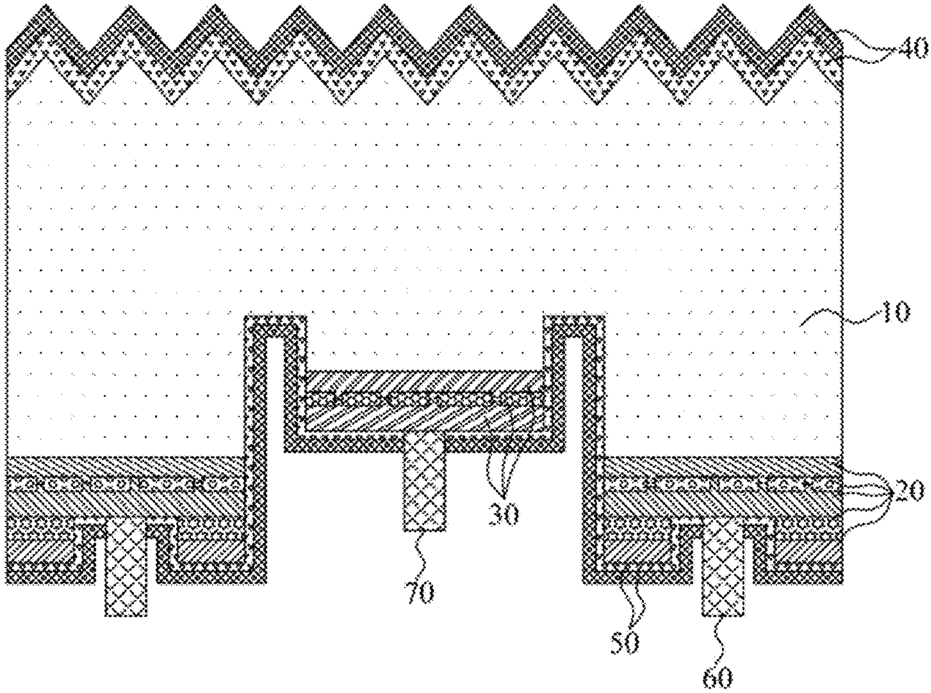

In another preferred embodiment of this embodiment, a third passivation layer and a fifth doped layer are disposed on the fourth doped layer in sequence, as shown in FIG. 4, FIG. 7, and FIG. 10. The fourth doped layer, the third passivation layer, and the fifth doped layer form a doped region structure, which is substantially similar to the first passivated contact region in the above embodiments. The third passivation layer is also a porous structure. For a specific structure of the third passivation layer, refer to the first passivation layer in the above embodiments. In this embodiment, the fourth doped layer and the fifth doped layer have a same doping polarity. Since the first doped region 20 and the second doped region 30 have opposite polarities, when the first doped layer and the second doped layer are the N-type doped layers, and the third doped layer is the P-type doped layer, the fourth doped layer and the fifth doped layer are correspondingly the P-type doped layers having opposite polarities. Thus, for preparation of the fourth doped layer, the third passivation layer, and the fifth doped layer, also refer to the above embodiments. The third passivation layer which is a porous structure is first prepared on the silicon substrate 10. Then, the fifth doped layer is prepared on the third passivation layer. During preparation of the fifth doped layer, a doped source directly penetrates the third passivation layer or holes in the porous structure to form the fourth doped layer in the silicon substrate 10. Since the second passivation layer and the third doped layer have a similar structure and a same doping polarity as the third passivation layer and the fifth doped layer, the second passivation layer and the third doped layer may be synchronously manufactured by reusing a same process. However, it needs to be noted that, during preparation of the second passivation layer by means of deposition, additional chemical corrosion, dry etching, or thermal diffusion impact is not required to prepare the porous structure. Since a deposition time of the second passivation layer is longer than a deposition time of the third passivation layer, a thickness of the second passivation layer is greater than a thickness of the third passivation layer.

When the first doped region 20 and the second doped region 30 both use the passivated contact structure described in the above embodiments, a material and a thickness selected for each layer structure in the first doped region 20 may be same as or different from those selected for each layer structure in the second doped region 30. For example, when a first passivation layer in the first doped region 20 is specifically selected as a silicon oxide layer and a silicon carbide layer, a first passivation layer in the second doped region 30 may be selected to be the same as the first passivation layer in the first doped region 20, or may be selected as a material different from the first passivation layer in the first doped region 20, such as an aluminum oxide layer and a silicon carbide layer.

A thickness of the first passivation layer in the first doped region 20 may be designed same as or different from a thickness of the first passivation layer in the second doped region 30. Preferably, regardless of whether the material of the first passivation layer in the first doped region 20 is the same as the material of the first passivation layer in the second doped region 30, the thickness of the first passivation layer corresponding to the first doped layer doped with the group-III element is designed to be larger, and the thickness of the first passivation layer corresponding to the first doped layer doped with the group-V element is designed to be smaller. That is to say, the thickness of the first passivation layer in the P-type doped region is greater than the thickness of the first passivation layer in the N-type doped region. A main reason lies in that the P-type doped region requires a process such as boron doping and a higher temperature, and requires a thicker first passivation layer due to a requirement for a plurality of heat treatment processes. In this embodiment, the material and the thickness of each layer structure in the first doped region 20 and in the second doped region 30 are correspondingly designed according to actual use requirements, which are not specifically limited herein.

In addition, in a preferred embodiment of the disclosure, a hole density of the first passivation layer in the P-type doped region is greater than a hole density of the first passivation layer in the N-type doped region. The hole density means a quantity of holes per unit area. That is to say, in a same unit area, the first passivation layer in the P-type doped region has more holes than the first passivation layer in the N-type doped region. A main reason lies in that a conductivity of the P-type doped region is relatively poor, and the thickness of the first passivation layer in the P type doped region is relatively large. Therefore, more holes are required to enhance the conductivity.

It needs to be noted that, when one of the first doped region 20 and the second doped region 30 is a doped region structure comprising the fourth doped layer, the third passivation layer, and the fifth doped layer, reference may also be made to the above embodiments. A material and a thickness of the first passivation layer in the passivated contact structure may be same as or different from those of the third passivation layer in the doped region structure. For example, when the passivated contact structure is the P-type doped region, and the doped region structure is the N-type doped region, preferably, the thickness of the first passivation layer in the passivated contact structure is greater than the thickness of the third passivation layer in the doped region structure, and a hole density of the first passivation layer in the passivated contact structure is greater than a hole density of the third passivation layer in the doped region structure.

In an embodiment of the disclosure, the first dielectric layer 40 and the second dielectric layer 50 each are an aluminum oxide layer, a silicon nitride layer, a silicon oxynitride layer, a silicon carbide layer, an amorphous silicon layer, a silicon oxide layer, or a combination thereof. The first dielectric layer 40 and the second dielectric layer 50 achieve a passivation effect. The first dielectric layer 40 and the second dielectric layer 50 each are designed as a structure having at least one layer. Refractive indexes of the first dielectric layer and the second dielectric layer decrease from the silicon substrate 10 toward the outside, so that a film layer close to the silicon substrate 10 achieves the passivation effect, and a film layer away from the silicon substrate 10 achieves an antireflection effect, thereby enhancing the anti-reflection effect. In this way, the silicon substrate 10 absorbs and uses light more effectively, and the short-circuit current density is increased. Each film layer in the first dielectric layer 40 and in the second dielectric layer 50 that has a different structure may comprise a plurality of films each having a different refractive index. According to the above, the film layers are arranged such that the refractive indexes of the film layers decrease from the silicon substrate 10 toward the outside. For example, the silicon oxide layer in the first dielectric layer 40 may comprise a plurality of silicon oxide films having refractive indexes decreasing from the silicon substrate 10 toward the outside.

It should be noted that, the first dielectric layer 40 and the second dielectric layer 50 may have a same structural arrangement or different structural arrangements. The film layer structures in the first dielectric layer 40 and in the second dielectric layer 50 may be correspondingly designed according to actual use requirements, which are not specifically limited herein. Preferably, the first dielectric layer 40 and the second dielectric layer 50 are designed same, so that the first dielectric layer 40 and the second dielectric layer 50 may be prepared on the front side and the back side of the silicon substrate 10 respectively by using a same process.

In a preferred embodiment of the disclosure, the first dielectric layer 40 and/or the second dielectric layer 50 include(s) a double-layer structure of an aluminum oxide layer and a silicon carbide layer or a double-layer structure of a silicon oxide layer and a silicon carbide layer. In this case, an entire thickness of the first dielectric layer 40 is greater than 50 nm, and an entire thickness of the second dielectric layer 50 is greater than 25 nm. It may be understood that the specific structure arrangements of the first dielectric layer 40 and the second dielectric layer 50 include but are not limited to the specific examples listed above.

Further, in an embodiment of the disclosure, a thickness of the aluminum oxide layer or the silicon oxide layer in the first dielectric layer 40 is less than 40 nm. A thickness of the aluminum oxide layer or the silicon oxide layer in the second dielectric layer 50 is less than 25 nm. A thickness of the silicon carbide layer in the first dielectric layer 40 and/or in the second dielectric layer 50 is greater than 10 nm. The silicon carbide layer in the first dielectric layer 40 and/or in the second dielectric layer 50 can not only provide a hydrogen passivation effect, but also reduce parasitic light absorption by virtue of a large optical band gap and a small absorption coefficient.

It needs to be noted that, the multi-layer structure in this embodiment of the disclosure conforms to an arrangement sequence from the silicon substrate 10 toward the outside. For example, when the above first dielectric layer 40 includes the aluminum oxide layer and the silicon carbide layer, the aluminum oxide layer is close to the silicon substrate 10, and the silicon carbide layer is close to the outside. It needs to be further noted that, in the drawings, FIG. 2 to FIG. 11 only show the first dielectric layer 40 and the second dielectric layer 50 as double-layer structures. However, it may be understood that the first dielectric layer 40 and the second dielectric layer 50 may also include other quantities of layers. Respective specific structures may be designed according to actual needs, and are not completely limited to the drawings. It needs to be further noted that, each drawing of the disclosure is merely used to describe the specific structural distribution in the solar cell, but does not correspond to an actual size of each structure. The drawings do not completely correspond to specific actual sizes in this embodiment, and the actual size of each structure needs to conform to specific parameters provided in this embodiment.

Further, the silicon carbide layer in the first dielectric layer 40 and/or in the second dielectric layer 50 comprises at least one silicon carbide film. The refractive indexes of the silicon carbide films decrease from the silicon substrate 10 toward the outside. Optionally, the refractive index of the each material may be generally selected as follows: the refractive index of monocrystalline silicon is 3.88, the refractive index of amorphous silicon is in a range of 3.5-4.2, the refractive index of polysilicon is 3.93, the refractive index of silicon carbide is in a range of 2-3.88, the refractive index of silicon nitride is in a range of 1.9-3.88, the refractive index of silicon oxynitride is in a range of 1.45-3.88, the refractive index of silicon oxide is 1.45, and the refractive index of aluminum oxide is 1.63. It may be understood that the refractive indexes of the above materials may also be set to other values according to actual use requirements, which are not specifically limited herein.

Further, in an embodiment of the disclosure, a magnesium fluoride layer is further disposed outside the first dielectric layer 40 and/or the second dielectric layer 50. That is to say, in addition to one or a combination of more of the aluminum oxide layer, the silicon nitride layer, the silicon oxynitride layer, the silicon carbide layer, the amorphous silicon layer, and the silicon oxide layer selected for the first dielectric layer 40 and the second dielectric layer 50, a magnesium fluoride layer may be further disposed outside the first dielectric layer 40 and/or the second dielectric layer 50. The magnesium fluoride layer is required to have a lowest refractive index. Generally, the refractive index is set to 1.4. The magnesium fluoride layer has an optical effect of enhancing antireflection.

Further, in an embodiment of the disclosure, an electric field layer or a floating junction is further disposed between the front side of the silicon substrate 10 and the first dielectric layer 40. Specifically, the electric field layer is prepared by means of phosphorus diffusion on the silicon substrate 10, or the floating junction is prepared by means of boron diffusion. The electric field layer or the floating junction is used as a front surface electric field of the solar cell.

In an embodiment of the disclosure, the first conductive layer 60 and/or the second conductive layer 70 are/is a TCO transparent conductive film and/or a metal electrode. The metal electrode includes a silver electrode, a copper electrode, an aluminum electrode, a tin-coated copper electrode, or a silver-coated copper electrode. Further, the copper electrode is electroplated copper prepared by using an electroplating process or the copper electrode prepared by means of physical vapor deposition. A nickel electrode, a chromium electrode, a titanium electrode, or a tungsten electrode is used as a seed layer or a protective layer of the electroplated copper. It needs to be noted that, the first conductive layer 60 and the second conductive layer 70 may select a same electrode or different electrodes. For example, the first conductive layer 60 and the second conductive layer 70 both select the aluminum electrode, or the first conductive layer 60 selects the silver electrode, and the second conductive layer 70 selects the aluminum electrode.

Further, in an embodiment of the disclosure, a texturing process is further performed before the first dielectric layer 40 is prepared on the front side of the silicon substrate 10. A shape formed on the front side includes but is not limited to an alkali polished surface, a mechanically polished surface, a random pyramid shape, an inverted pyramid shape, a spherical cap shape, a V-shaped groove, and a shape ranging among the above shapes. The surface shape formed on the front side of the silicon substrate 10 helps reduce the reflection of sunlight on the front side, thereby improving the conversion efficiency of the solar cell.

Further, in an embodiment of the disclosure, the second dielectric layer 50 may cover only a region between the first doped region 20 and the second doped region 30 on the silicon substrate 10, or may extend to cover the first doped region 20 and/or the second doped region 30. When the second dielectric layer 50 covers only the region between the first doped region 20 and the second doped region 30 on the silicon substrate 10, the first conductive layer 60 covers an entire back side of the first doped region 20 for electric connection, and the second conductive layer 70 covers an entire back side of the second doped region 30 for electric connection. When the second dielectric layer 50 extends to cover the first doped region 20 and/or the second doped region 30, the first conductive layer 60 covers a back surface of a remaining part that not covered by the second dielectric layer 50 in the first doped region 20 for achieve electric connection, and the second conductive layer 70 covers a back surface of a remaining part not covered by the second dielectric layer 50 in the second doped region 30 for electric connection. When the second dielectric layer 50 covers the entire back side, the first conductive layer 60 penetrates the second dielectric layer 50 through perforations or the like to be electrically connected to the first doped region 20, and the second conductive layer 70 penetrates the second dielectric layer 50 through perforations or the like to be electrically connected to the second doped region 30. The conductive polarities of the first conductive layer 60 and the second conductive layer 70 are determined according to the polarities of the first doped region 20 and the second doped region 30, which are not specifically limited herein.

Figure 3:
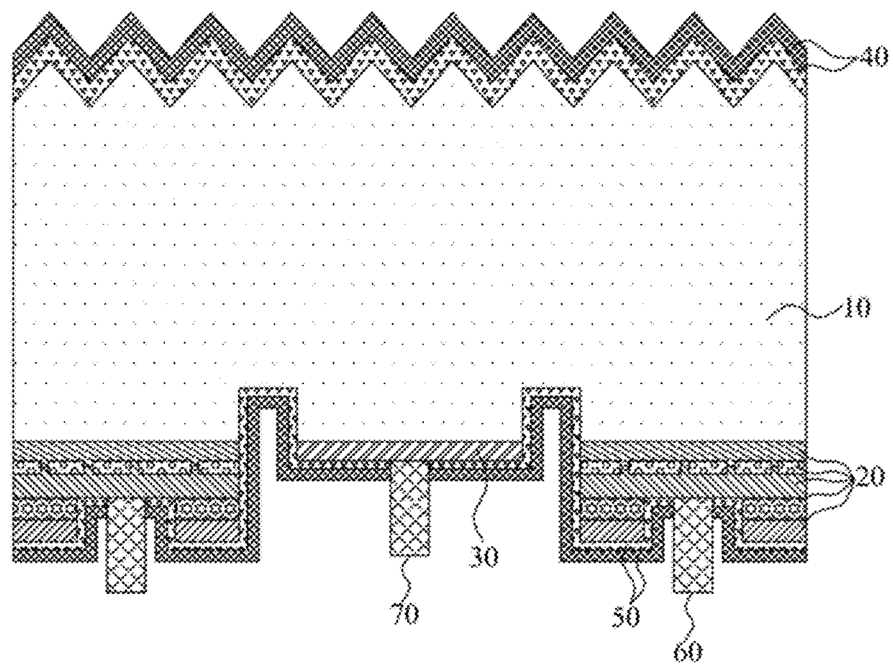

In an embodiment of the disclosure, referring to FIG. 2, FIG. 3, and FIG. 4, the first doped region 20 and the second doped region 30 are alternately disposed on the back side of the silicon substrate 10. In order to avoid undesirable phenomena such as electric leakage caused by unobstructed connection between the first doped region 20 and the second doped region 30, a trench is provided between the first doped region 20 and the second doped region 30. The trench separates the first doped region 20 from the second doped region 30. Correspondingly, the second dielectric layer 50 covers the trench. It needs to be noted that, a surface shape of the trench that is in contact with the silicon substrate 10 may further have a rough texture structure disposed thereon. The rough texture structure is usually formed by means of texturing, and includes but is not limited to an alkali polished surface, a mechanically polished surface, a random pyramid shape, an inverted pyramid shape, a spherical cap shape, a V-shaped groove, and a shape ranging among the above shapes. An irregular hemispherical texture may be formed by means of acid texturing, a pyramid-shaped texture may be formed by means of alkali texturing, or the pyramid-shaped texture may be formed first by means of alkali texturing and then smoothing is performed on a top of a pyramid-shaped by means of acid texturing. In this way, the surface shape formed at the trench on the back side of the silicon substrate 10 helps the silicon substrate 10 absorb and reuse light more effectively, and the short-circuit current density is increased, thereby enhancing the conversion efficiency of the solar cell.

Figure 6:
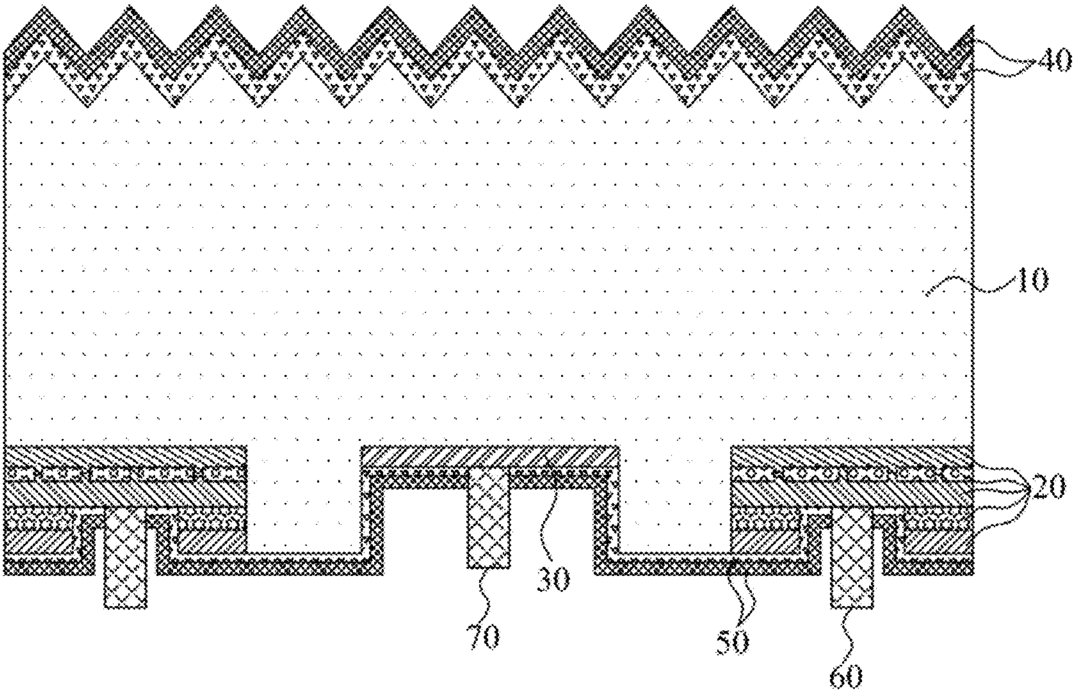

In another embodiment of the disclosure, referring to FIG. 5, FIG. 6, and FIG. 7, grooves spaced apart are provided on the back side of the silicon substrate 10. The first doped region 20 and the second doped region 30 are alternately disposed in the grooves. The grooves may be formed by means of laser ablation or by using a combination of a mask (such as a hard mask, a silicon oxide mask, a silicon nitride mask, or a photoresist mask) and wet/dry etching. By means of the grooves spaced apart on the back side of the silicon substrate 10, a region between two adjacent grooves of the silicon substrate 10 is generally formed into a protrusion shape. Therefore, the blocking between the first doped region 20 and the second doped region 30 disposed in the grooves can be realized by the protrusion structure between the grooves of the silicon substrate 10. Definitely, optionally, a trench may be further disposed between the first doped region 20 and the second doped region 30. In this case, a trench may be provided in the protrusion structure or the groove, so that double isolation between the first doped region 20 and the second doped region 30 can be realized by the protrusion structure between the grooves of the silicon substrate 10 and the trench structure.

The first doped region 20 and the second doped region 30 include at least the passivated contact structure described in the above embodiments. It needs to be noted that, the passivation layer in the passivated contact structure may cover only a bottom wall of the grooves, or may extend to cover sidewalls of the groove. Preferably, the passivation layer covers the bottom wall and the sidewalls of the groove. In this case, the first doped layer is correspondingly disposed on the bottom wall and the sidewalls of the groove. Therefore, carriers generated on the silicon substrate 10 are easily separated by using the passivation layer on the sidewalls of the groove and selectively collected in the corresponding second doped layer. In this way, multidimensional collection of the carriers in the bottom wall and the sidewalls of the groove can be realized. It needs to be noted that, the first doped region 20 and the second doped region 30 may be respectively disposed in partial regions in the corresponding grooves.

Further, in an embodiment of the disclosure, the groove is in a circular arc shape, a trapezoidal shape, or a square shape. The groove is preferably designed as the circular arc shape or the trapezoidal shape. When the groove is designed as the circular arc shape or the trapezoidal shape, inner walls of the groove can reflect light more desirably, and a surface area of the first passivation layer of the passivated contact structure that is in contact with the first doped layer can be further increased. Definitely, when the groove is designed as the square shape, an actual production process is much simpler. It needs to be further noted that, the grooves may have a same shape or different shapes. For example, the groove of the first doped region 20 and the groove of the second doped region 30 are designed as the square shape, or the groove of the first doped region 20 is designed as the square shape, and the groove of the second doped region 30 is designed as the circular arc shape, or the like. Thus, the shapes of the grooves may be designed according to actual use requirements, which are not specifically limited herein. Further, a width and a depth of each groove may be designed same or differently, and may be designed according to actual use requirements, which are not specifically limited herein.

Further, in an embodiment of the disclosure, a total thickness of the first doped region 20 and/or a total thickness of the second doped region 30 may be greater than, less than, or equal to the depth of the groove. When the total thickness of the first doped region 20 and/or the total thickness of the second doped region 30 are/is less than or equal to the depth of the groove, the first doped region 20 and/or the second doped region 30 do/does not extend out of the groove. Therefore, the blocking of the first doped region 20 and/or the second doped region 30 is realized directly by the protrusion structure between the grooves. When the total thickness of the first doped region 20 and/or the total thickness of the second doped region 30 are/is greater than the depth of the groove, the first doped region 20 and/or the second doped region 30 may extend to protrusion regions among the grooves. That is to say, for example, the first doped region 20 may extend to a partial or entire region between the grooves, but does not come into contact with the adjacent second doped region 30.

Further, in an embodiment of the disclosure, the back side of the silicon substrate 10 in the protrusion regions among the grooves has a rough texture structure. The rough texture structure is usually formed by means of texturing, and includes but is not limited to an alkali polished surface, a mechanically polished surface, a random pyramid shape, an inverted pyramid shape, a spherical cap shape, a V-shaped groove, and a shape ranging among the above shapes. An irregular hemispherical texture may be formed by means of acid texturing, a pyramid-shaped texture may be formed by means of alkali texturing, or the pyramid-shaped texture may be formed first by means of alkali texturing and then smoothing is performed on a top of a pyramid-shaped by means of acid texturing. It may be understood that the rough texture structure may also be arranged on the entire back side of the silicon substrate 10.

Figure 9:
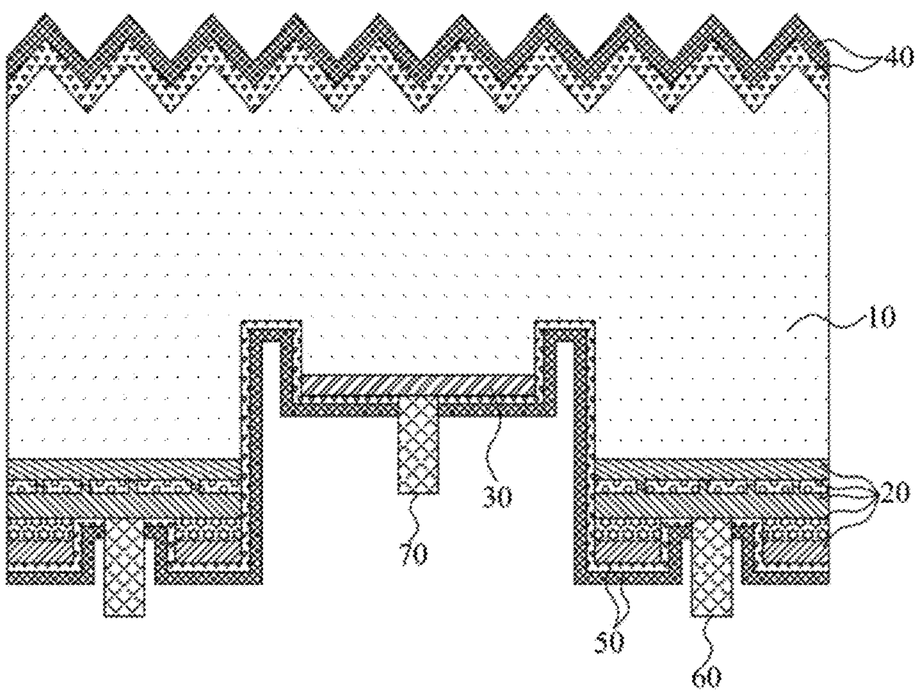
Figure 11:
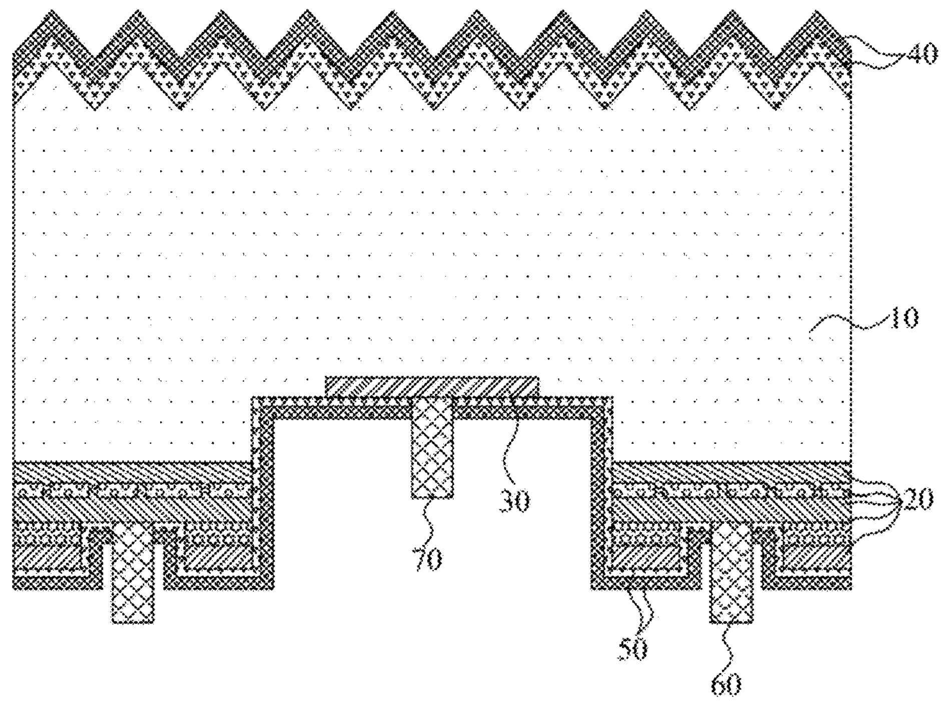

In still another embodiment of the disclosure, referring to FIG. 8 to FIG. 11, grooves spaced apart are provided on the back side of the silicon substrate 10. One of the first doped region 20 and the second doped region 30 is disposed in one of the grooves, and the other of the first doped region and the second doped region is disposed outside the grooves. In order to realize the blocking between the first doped region 20 and the second doped region 30, a trench may be further provided between the first doped region 20 and the second doped region 30. The first doped region 20 is separated from the second doped region 30 by the trench, as shown in FIG. 8, FIG. 9, and FIG. 10. The first doped region 20 and the second doped region 30 may also be disposed in partial regions inside and outside the grooves, so that the silicon substrate 10 inside and outside the grooves that is not covered by the first doped region 20 and the second doped region 30 realizes the separation of the first doped region 20 from the second doped region 30, as shown in FIG. 11. Definitely, the non-contact between the first doped region 20 and the second doped region 30 may also be realized by setting the depth of the groove. For other specific descriptions of the groove and the first doped region 20 and the second doped region 30 disposed inside and outside the grooves, refer to the above descriptions, and details are not described herein again.

Therefore, in an embodiment of the disclosure, the first doped region 20 and the second doped region 30 both may be disposed on the back side of the silicon substrate 10, or both may be disposed on the grooves spaced apart on the silicon substrate 10, or may be respectively disposed inside and outside the grooves spaced on the silicon substrate 10. The first doped region 20 and the second doped region 30 include at least the passivated contact structure described in the above embodiments, and include a diffusion structure comprising the fourth doped layer, the doped region structure comprising the fourth doped layer, the third passivation layer, and the fifth doped layer, or a conventional passivated contact structure comprising a tunneling layer and a doped region. Thus, the prepared solar cell may be as follows.

Cell I: The first doped region 20 and the second doped region 30 are both disposed on the back side of the silicon substrate 10. The first doped region 20 and the second doped region 30 have the passivated contact structure described in the above embodiments. A trench is provided between the first doped region 20 and the second doped region 30.

Cell II: The first doped region 20 and the second doped region 30 are both disposed on the back side of the silicon substrate 10. One of the first doped region 20 and the second doped region 30 has the passivated contact structure described in the above embodiments, and the other of the first doped region and the second doped region has the diffusion structure comprising the fourth doped layer. A trench is provided between the first doped region 20 and the second doped region 30.

Cell III: The first doped region 20 and the second doped region 30 are both disposed on the back side of the silicon substrate 10. One of the first doped region 20 and the second doped region 30 has the passivated contact structure described in the above embodiments, and the other of the first doped region and the second doped region has the doped region structure comprising the fourth doped layer, the third passivation layer, and the fifth doped layer. A trench is provided between the first doped region 20 and the second doped region 30.

Cell IV: The first doped region 20 and the second doped region 30 are both disposed on the back side of the silicon substrate 10. One of the first doped region 20 and the second doped region 30 has the passivated contact structure described in the above embodiments, and the other of the first doped region and the second doped region has the conventional passivated contact structure comprising the tunneling layer and the doped region. A trench is provided between the first doped region 20 and the second doped region 30.

Cell V: The first doped region 20 and the second doped region 30 are alternately disposed in the grooves of the silicon substrate 10. The first doped region 20 and the second doped region 30 both have the passivated contact structure described in the above embodiments.

Cell VI: The first doped region 20 and the second doped region 30 are alternately disposed in the grooves of the silicon substrate 10. One of the first doped region 20 and the second doped region 30 has the passivated contact structure described in the above embodiments, and the other of the first doped region and the second doped region has the diffusion structure comprising the fourth doped layer.

Cell VII: The first doped region 20 and the second doped region 30 are alternately disposed in the grooves of the silicon substrate 10. One of the first doped region 20 and the second doped region 30 has the passivated contact structure described in the above embodiments, and the other of the first doped region and the second doped region has the doped region structure comprising the fourth doped layer, the third passivation layer, and the fifth doped layer.

Cell VIII: The first doped region 20 and the second doped region 30 are alternately disposed in the grooves of the silicon substrate 10. One of the first doped region 20 and the second doped region 30 has the passivated contact structure described in the above embodiments, and the other of the first doped region and the second doped region has the conventional passivated contact structure comprising the tunneling layer and the doped region.

Cell IX: The first doped region 20 is disposed in the groove, and the second doped region 30 is disposed on the protrusion. The first doped region 20 and the second doped region 30 both have the passivated contact structure described in the above embodiments. A trench may be provided between the first doped region 20 and the second doped region 30.

Cell X: One of the first doped region 20 and the second doped region 30 has the passivated contact structure described in the above embodiments, and the other of the first doped region and the second doped region has the diffusion structure comprising the fourth doped layer. The passivated contact structure is disposed on the protrusion, and the diffusion structure is disposed in the groove. A trench may be provided between the first doped region 20 and the second doped region 30.

Cell XI: One of the first doped region 20 and the second doped region 30 has the passivated contact structure described in the above embodiments, and the other of the first doped region and the second doped region has the diffusion structure comprising the fourth doped layer. The passivated contact structure is disposed in the groove, and the diffusion structure is disposed on the protrusion. A trench may be provided between the first doped region 20 and the second doped region 30.

Cell XII: One of the first doped region 20 and the second doped region 30 has the passivated contact structure described in the above embodiments, and the other of the first doped region and the second doped region has the doped region structure comprising the fourth doped layer, the third passivation layer, and the fifth doped layer. The passivated contact structure is disposed on the protrusion, and the doped region structure is disposed in the groove. A trench may be provided between the first doped region 20 and the second doped region 30.

Cell XIII: One of the first doped region 20 and the second doped region 30 has the passivated contact structure described in the above embodiments, and the other of the first doped region and the second doped region has the doped region structure comprising the fourth doped layer, the third passivation layer, and the fifth doped layer. The passivated contact structure is disposed in the groove, and the doped region structure is disposed on the protrusion. A trench may be provided between the first doped region 20 and the second doped region 30.

Cell XIV: One of the first doped region 20 and the second doped region 30 has the passivated contact structure described in the above embodiments, and the other of the first doped region and the second doped region has the conventional passivated contact structure comprising the tunneling layer and the doped region. The passivated contact structure is disposed on the protrusion, and the conventional passivated contact structure is disposed in the groove. A trench may be provided between the first doped region 20 and the second doped region 30.

Cell XV: One of the first doped region 20 and the second doped region 30 has the passivated contact structure described in the above embodiments, and the other of the first doped region and the second doped region has the conventional passivated contact structure comprising the tunneling layer and the doped region. The passivated contact structure is disposed in the groove, and the conventional passivated contact structure is disposed on the protrusion. A trench may be provided between the first doped region 20 and the second doped region 30.

In this embodiment, an opening is provided in the second passivated contact region, and the conductive layer penetrates the opening to be connected to the first passivated contact region, so that the conductive layer is disposed in the first passivated contact region. Therefore, the second passivated contact region surrounding the conductive layer can form isolating protection for the conductive layer, thereby forming isolation between an emitter and the conductive layer disposed on a back surface field in the cell prepared by using the passivated contact structure. In this way, the isolation effect is enhanced, and the recombination of a space-charge region is reduced. When no opening is provided in advance, the conductive layer may be directly printed on the second passivated contact region for sintering, to cause the conductive layer to pass through the second passivated contact region, so as to come into contact with the second doped layer of the first passivated contact region. In the prior art, when the conductive layer is printed on the second doped layer for sintering, the second doped layer and the passivation layer are easily burnt through, causing the conductive layer to come into direct contact with a silicon substrate, resulting in increased recombination and reduced conversion efficiency. By means of the embodiments of the disclosure, the above problems are resolved. In addition, the second passivated contact region further blocks pollutants, reducing a possibility of surface pollution. Moreover, the opening provided in the second passivated contact region may be used as an alignment reference during subsequent preparation of the conductive layer, so that the preparation of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. Hydrogen contained in the second doped layer and the third doped layer can diffuse inward in a high-temperature process, so that hydrogen passivation is enhanced. Therefore, the poor isolation effect of a conventional conductive layer, and the increased recombination and the reduced conversion efficiency caused by direct contact with a silicon substrate are resolved.

Example 3

Figure 12:
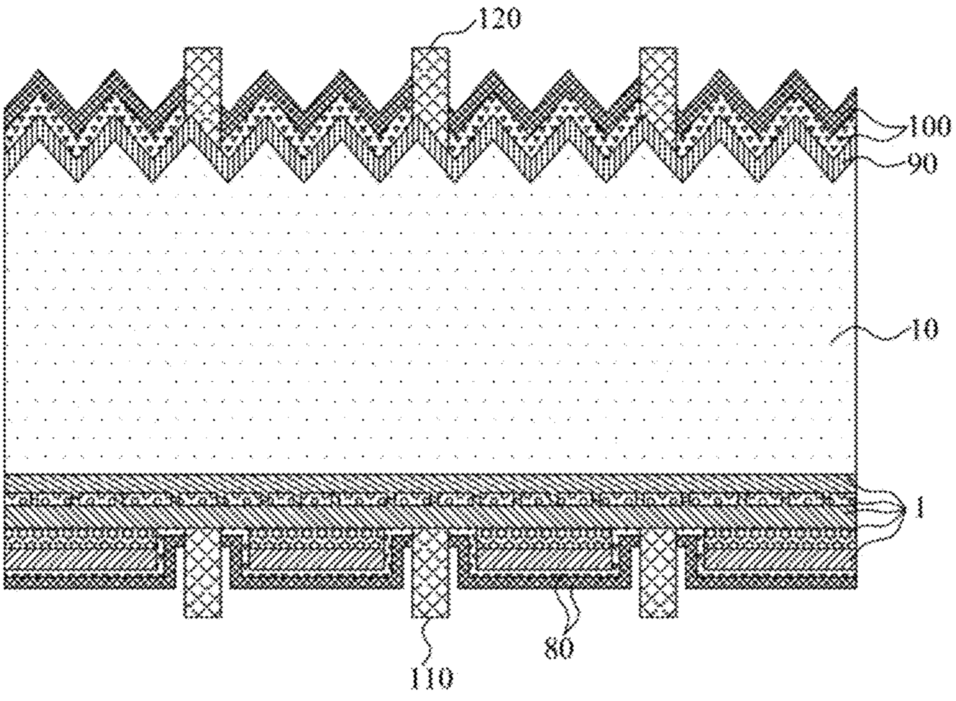
FIG. 12 is a schematic structural diagram of a solar cell according to another embodiment of the disclosure.

A third embodiment of the disclosure provides a solar cell. For ease of description, only parts related to this embodiment of the disclosure are shown. Referring to FIG. 12, the solar cell provided in this embodiment of the disclosure includes:

a silicon substrate 10;

the passivated contact structure 1 described in the above embodiments, disposed on a back side of the silicon substrate 10;

a third dielectric layer 80, disposed on the passivated contact structure 1;

a sixth doped layer 90 and a fourth dielectric layer 100, disposed on a front side of the silicon substrate 10 in sequence; and a third conductive layer 110 and a fourth conductive layer 120, respectively electrically connected to the passivated contact structure 1 and the sixth doped layer 90.

The passivated contact structure 1 and the sixth doped layer 90 have opposite polarities.

The sixth doped layer 90 is a monocrystalline silicon doped layer doped with a group-III or group-V element. For details of the sixth doped layer, refer to the description of the first doped layer in passivated contact structure 1 in the above embodiments. It needs to be noted that, since the doped region structure and the sixth doped region 90 have opposite polarities, the first doped layer and the sixth doped layer 90 are respectively doped with an element of a different group. That is to say, when the first doped layer is doped with a Group-III element, the sixth doped layer 90 is doped with a Group-V element. When the first doped layer is doped with a group-V element, the sixth doped layer 90 is doped with a group-III element.

In an embodiment of the disclosure, the third dielectric layer 80 and the fourth dielectric layer 100 each are one or a combination of a plurality of an aluminum oxide layer, a silicon nitride layer, a silicon oxynitride layer, a silicon carbide layer, an amorphous silicon layer, and a silicon oxide layer. The third dielectric layer 80 and the fourth dielectric layer 100 achieve a passivation effect. The third dielectric layer 80 and the fourth dielectric layer 100 each are designed as a structure having at least one layer. Refractive indexes of the third dielectric layer and the fourth dielectric layer decrease from the silicon substrate 10 toward the outside, so that a film layer close to the silicon substrate 10 achieves the passivation effect, and a film layer away from the silicon substrate 10 achieves an antireflection effect, thereby enhancing the anti-reflection effect. In this way, the silicon substrate 10 absorbs and uses light more effectively, and the short-circuit current density is increased. Each film layer in the third dielectric layer 80 and in the fourth dielectric layer 100 that has a different structure may comprise a plurality of films each having a different refractive index. According to the above, the film layers are arranged such that the refractive indexes of the film layers decrease from the silicon substrate 10 toward the outside. For example, the silicon oxide layer in the third dielectric layer 80 may comprise a plurality of silicon oxide films having refractive indexes decreasing from the silicon substrate 10 toward the outside.

It should be noted that, the third dielectric layer 80 and the fourth dielectric layer 100 may have a same structural arrangement or different structural arrangements. The film layer structures in the third dielectric layer 80 and the fourth dielectric layer 100 may be correspondingly designed according to actual use requirements, which are not specifically limited herein. Preferably, the third dielectric layer 80 and the fourth dielectric layer 100 are designed same, so that the fourth dielectric layer 100 and the third dielectric layer 80 may be prepared on the front side and the back side of the silicon substrate 10 respectively by using a same process.

In a preferred embodiment of the disclosure, the third dielectric layer 80 and/or the fourth dielectric layer 100 include/includes a double-layer structure of an aluminum oxide layer and a silicon carbide layer or a double-layer structure of a silicon oxide layer and a silicon carbide layer. An entire thickness of the third dielectric layer 80 is greater than 25 nm, and an entire thickness of the fourth dielectric layer 100 is greater than 50 nm. It may be understood that the specific structural arrangements of the third dielectric layer 80 and the fourth dielectric layer 100 include but are not limited to the specific examples listed above.

Further, in an embodiment of the disclosure, a thickness of the aluminum oxide layer or the silicon oxide layer in the third dielectric layer 80 is less than 25 nm. A thickness of the aluminum oxide layer or the silicon oxide layer in the fourth dielectric layer 100 is less than 40 nm. A thickness of the silicon carbide layer in the third dielectric layer 80 and/or in the fourth dielectric layer 100 is greater than 10 nm. The silicon carbide layer in the third dielectric layer 80 and/or in the fourth dielectric layer 100 can not only provide a hydrogen passivation effect, but also reduce parasitic light absorption by virtue of a large optical band gap and a small absorption coefficient.

It needs to be noted that, the multi-layer structure in this embodiment of the disclosure conforms to an arrangement sequence from the silicon substrate 10 toward the outside. For example, when the above third dielectric layer 80 includes the aluminum oxide layer and the silicon carbide layer, the aluminum oxide layer is close to the silicon substrate 10, and the silicon carbide layer is close to the outside. It needs to be further noted that, in the drawings, FIG. 12 only shows the third dielectric layer 80 and the fourth dielectric layer 100 as double-layer structures. However, it may be understood that the third dielectric layer 80 and the fourth dielectric layer 100 may also include other quantities of layers. Respective specific structures may be designed according to actual needs, and are not completely limited to the drawings. It needs to be further noted that, each drawing of the disclosure is merely used to describe the specific structural distribution in the solar cell, but does not correspond to an actual size of each structure. The drawings do not completely correspond to specific actual sizes in this embodiment, and the actual size of each structure needs to conform to specific parameters provided in this embodiment.

Further, the silicon carbide layer in the third dielectric layer 80 and/or in the fourth dielectric layer 100 comprises at least one silicon carbide film each having a specific refractive index. The refractive indexes of the silicon carbide films decrease from the silicon substrate 10 toward the outside. Optionally, the refractive index of the each material may be generally selected as follows: the refractive index of monocrystalline silicon is 3.88, the refractive index of amorphous silicon is in a range of 3.5-4.2, the refractive index of polysilicon is 3.93, the refractive index of silicon carbide is in a range of 2-3.88, the refractive index of silicon nitride is in a range of 1.9-3.88, the refractive index of silicon oxynitride is in a range of 1.45-3.88, the refractive index of silicon oxide is 1.45, and the refractive index of aluminum oxide is 1.63. It may be understood that the refractive indexes of the above materials may also be set to other values according to actual use requirements, which are not specifically limited herein.

Further, in an embodiment of the disclosure, a magnesium fluoride layer is further disposed outside the third dielectric layer 80 and/or the fourth dielectric layer 100. That is to say, in addition to one or a combination of more of the aluminum oxide layer, the silicon nitride layer, the silicon oxynitride layer, the silicon carbide layer, the amorphous silicon layer, and the silicon oxide layer selected for the third dielectric layer 80 and the fourth dielectric layer 100, a magnesium fluoride layer may be further disposed outside the third dielectric layer 80 and/or the fourth dielectric layer 100. The magnesium fluoride layer is required to have a lowest refractive index. Generally, the refractive index is set to 1.4. The magnesium fluoride layer has an optical effect of enhancing antireflection.

In an embodiment of the disclosure, the third conductive layer 110 and/or the fourth conductive layer 120 are/is a TCO transparent conductive film and/or a metal electrode. The metal electrode includes a silver electrode, a copper electrode, an aluminum electrode, a tin-coated copper electrode, or a silver-coated copper electrode. Further, the copper electrode is electroplated copper prepared by using an electroplating process or the copper electrode prepared by means of physical vapor deposition. A nickel electrode, a chromium electrode, a titanium electrode, or a tungsten electrode is used as a seed layer or a protective layer of the electroplated copper. It needs to be noted that, the third conductive layer 110 and the fourth conductive layer 120 may select a same material or different materials. For example, the third conductive layer 110 and the fourth conductive layer 120 both select the aluminum electrode, or the third conductive layer 110 selects the silver electrode, and the fourth conductive layer 120 selects the aluminum electrode. Further, the third conductive layer 110 penetrates the third dielectric layer 80 through perforations or the like to be electrically connected to the passivated contact structure 1. The third conductive layer 110 penetrates the fourth dielectric layer 100 through perforations or the like to be electrically connected to the sixth doped layer 90. The conductive polarities of the third conductive layer 110 and the fourth conductive layer 120 are determined according to the polarities of the passivated contact structure 1 and the sixth doped layer 90, which are not specifically limited herein.

Further, in an embodiment of the disclosure, a texturing process is further performed before the fourth dielectric layer 100 is prepared on the front side of the silicon substrate 10. A shape formed on the front side is not limited to an alkali polished surface, a mechanically polished surface, a random pyramid shape, an inverted pyramid shape, a spherical cap shape, a V-shaped groove, and a shape ranging among the above shapes. The surface shape formed on the front side of the silicon substrate 10 helps reduce the reflection of sunlight on the front side, thereby improving the conversion efficiency of the solar cell.

In this embodiment, an opening is provided in the second passivated contact region, and the conductive layer penetrates the opening to be connected to the first passivated contact region, so that the conductive layer is disposed in the first passivated contact region. Therefore, the second passivated contact region surrounding the conductive layer can form isolating protection for the conductive layer, thereby forming isolation between an emitter and the conductive layer disposed on a back surface field in the cell prepared by using the passivated contact structure. In this way, the isolation effect is enhanced, and the recombination of a space-charge region is reduced. When no opening is provided in advance, the conductive layer may be directly printed on the second passivated contact region for sintering, to cause the conductive layer to pass through the second passivated contact region, so as to come into contact with the second doped layer of the first passivated contact region. In the prior art, when the conductive layer is printed on the second doped layer for sintering, the second doped layer and the passivation layer are easily burnt through, causing the conductive layer to come into direct contact with a silicon substrate, resulting in increased recombination and reduced conversion efficiency. By means of the embodiments of the disclosure, the above problems are resolved. In addition, the second passivated contact region further blocks pollutants, reducing a possibility of surface pollution. Moreover, the opening provided in the second passivated contact region may be used as an alignment reference during subsequent preparation of the conductive layer, so that the preparation of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. Hydrogen contained in the second doped layer and the third doped layer can diffuse inward in a high-temperature process, so that hydrogen passivation is enhanced. Therefore, the poor isolation effect of a conventional conductive layer, and the increased recombination and the reduced conversion efficiency caused by direct contact with a silicon substrate are resolved.

Example 4

A fourth embodiment of the disclosure further provides a cell assembly. The cell assembly includes the solar cell described in Example 2.

Example 5

A fifth embodiment of the disclosure further provides a photovoltaic system. The photovoltaic system includes the cell assembly described in Example 4.

Example 6

A sixth embodiment of the disclosure further provides a cell assembly. The cell assembly includes the solar cell described in Example 3.

Example 7

A seventh embodiment of the disclosure further provides a photovoltaic system. The photovoltaic system includes the cell assembly described in Example 6.

In some embodiments, a protective region is arranged on the first doped region and no processing is performed on a second doped region. In this way, a third doped layer in the protective region is arranged on an outermost layer to provide an anti-scratch effect, thereby preventing scratching of the first doped region on an inner side of the protective region. In addition, since a height of the second doped region is less than a height of the protective region, only the protective region comes into contact with a belt during transmission, and a gap exists between the second doped region and the belt, so that suspension is achieved, thereby preventing scratching of the second doped region during the belt transmission. Therefore, scratches caused by the belt to the first doped region and the second doped region during the belt transmission are avoided. In this way, the scratches caused by the belt transmission in an existing cell fabrication process are resolved.

Example 8

Figure 13:
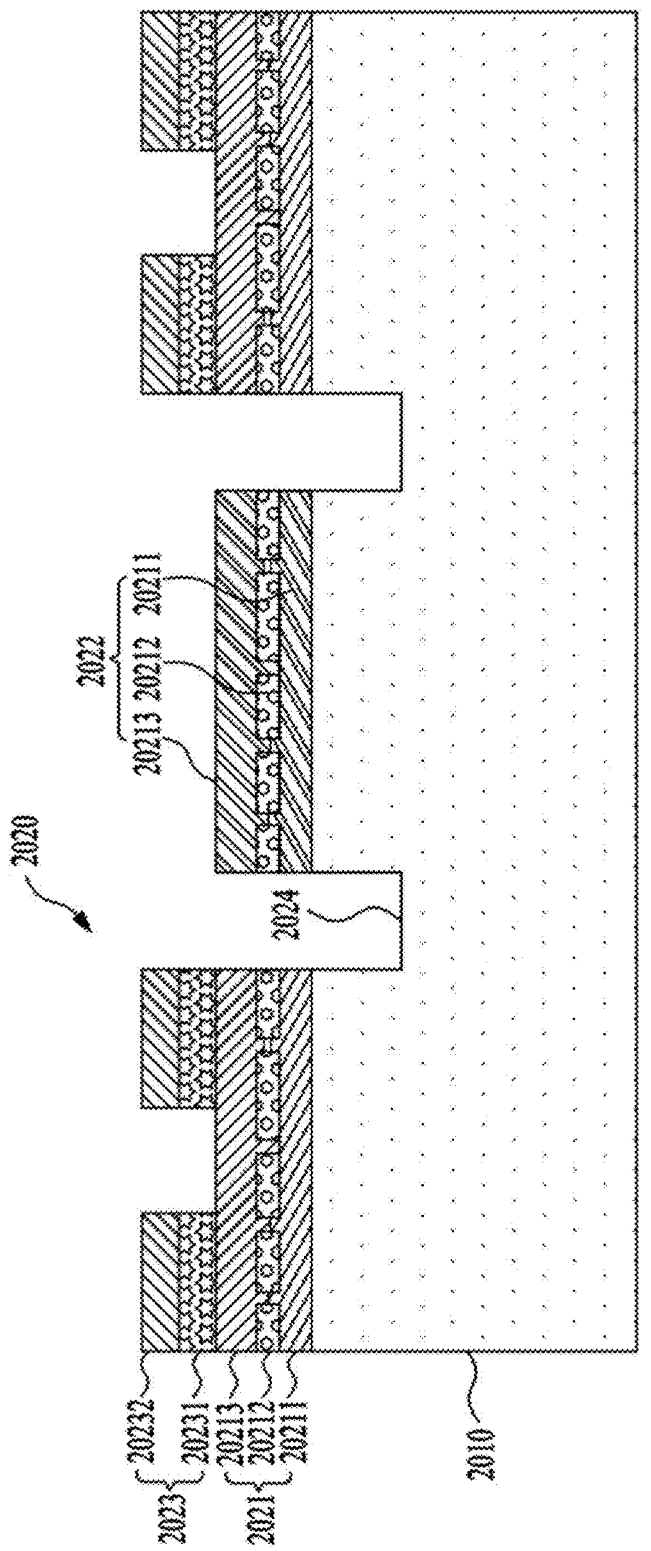
FIG. 13 is a schematic structural diagram of a back contact structure of a solar cell according to an embodiment of the present invention.

An embodiment of the present invention provides a back contact structure of a solar cell. For ease of description, only parts related to this embodiment of the present invention are shown. Referring to FIG. 13, the back contact structure 2020 of a solar cell provided in this embodiment of the present invention includes:

- a first doped region 2021 having an opposite polarity to a silicon substrate 2010 and a second doped region 2022 having a same polarity as the silicon substrate 2010, where the first doped region and the second doped region are spaced apart from each other on a back side of the silicon substrate 2010, and a protective region 2023 is arranged on the first doped region 2021.

Each of the first doped region 2021 and the second doped region 2022 includes a first doped layer 20211, a passivation layer 20212, and a second doped layer 20213.

The protective region 2023 includes an insulation layer 20231 and a third doped layer 20232 having a same polarity as the second doped region 2022.

An isolation region 2024 is arranged between the first doped region 2021 and the second doped region 2022.

An opening is provided in the protective region 2023, to connect the first conductive layer to the first doped region 2021.

A height of the first doped region 2021 and a height of the second doped region 2022 are both greater than a height of the isolation region 2024.

In an embodiment of the present invention, the silicon substrate 2010 has a front side facing the sun during normal operation and a back side opposite to the front side. The front side is a light-receiving surface. The back side is opposite to the front side and arranged on the other side of the silicon substrate 2010. That is to say, the front side and the back side are located on different opposite sides of the silicon substrate 2010. In this embodiment, the silicon substrate 2010 is an N-type monocrystalline silicon wafer. It may be understood that, in other embodiments, the silicon substrate 2010 may be silicon wafers of other types, such as a polysilicon wafer or a quasi-monocrystalline silicon wafer. The silicon substrate 2010 may alternatively be designed as a P type. The silicon substrate 2010 may be designed according to actual use requirements, and no specific limitation is imposed herein.

In an embodiment of the present invention, as shown in FIG. 13, the back contact structure 2020 includes a first region and a second region alternately arranged on the back side of the silicon substrate 2010 and having opposite polarities. The first region includes the first doped region 2021 arranged on the back side of the silicon substrate 2010 and the protective region 2023 arranged on the first doped region 2021, and the second region includes the second doped region 2022 arranged on the back side of the silicon substrate 2010. The polarity of the first region is opposite to that of the silicon substrate 2010, and the polarity of the second region is the same as that of the silicon substrate 2010. Therefore, in this embodiment, the first doped region 2021 in the first region is a P-type doped region, and the second doped region 2022 in the second region is an N-type doped region. It may be understood that, in other embodiments of the present invention, when the silicon substrate 2010 is a P-type silicon wafer, the first doped region 2021 is correspondingly an N-type doped region, and the second doped region 2022 is correspondingly a P-type doped region.

Figure 14:
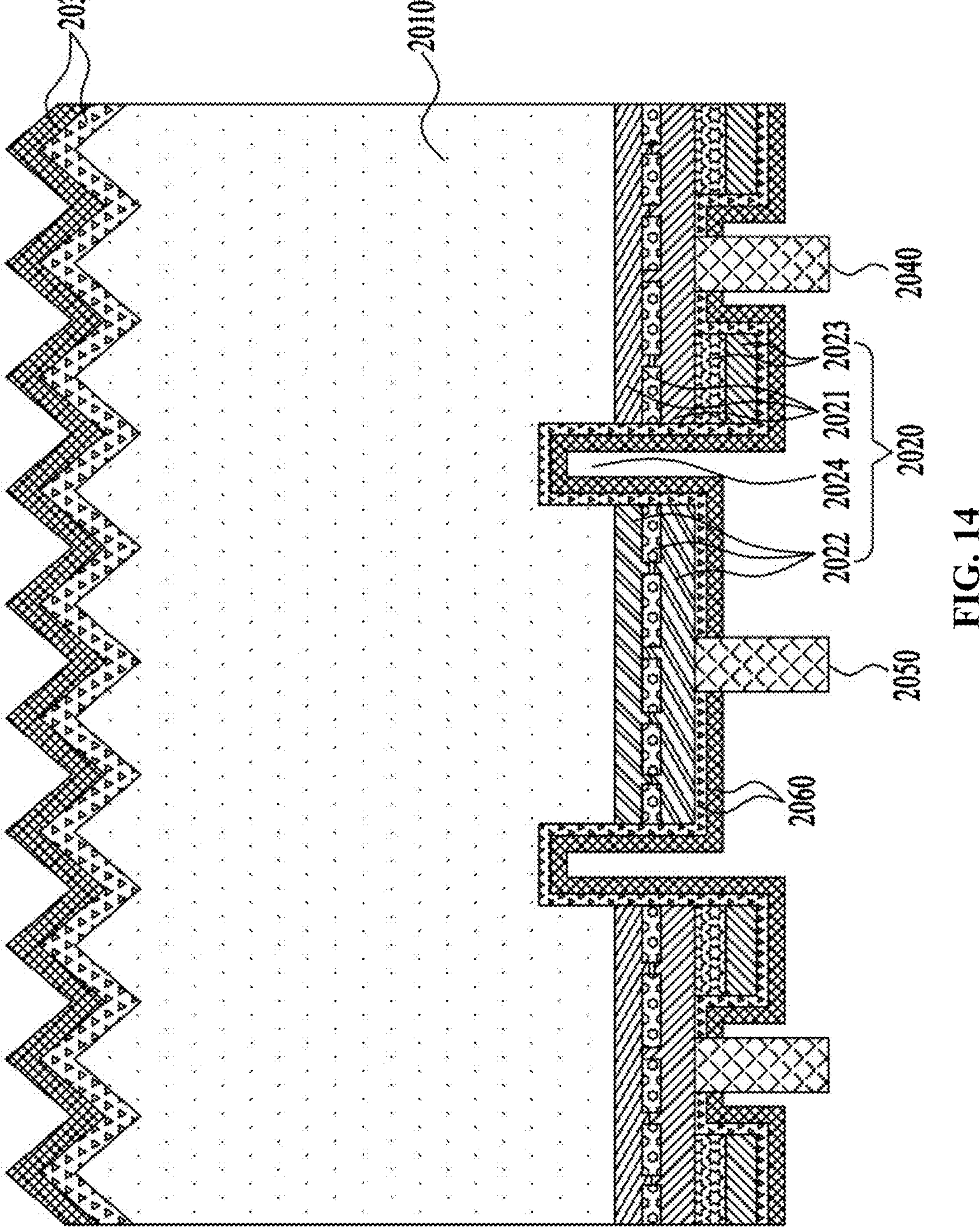
FIG. 14 and FIG. 15 are schematic structural diagrams of a solar cell during various implementation according to an embodiment of the present invention.
Figure 15:
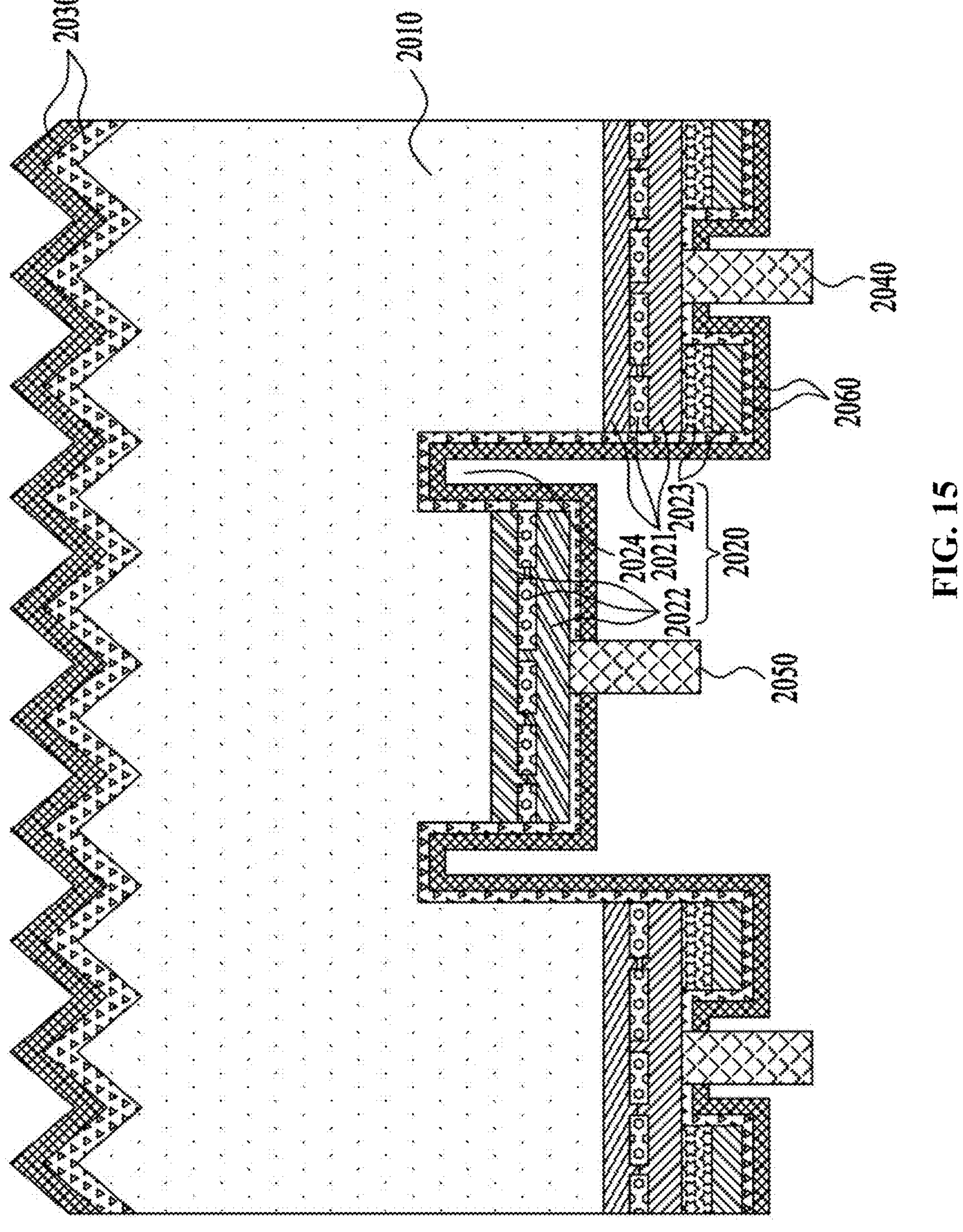

Further, in an embodiment of the present invention, each of the first doped region 2021 and the second doped region 2022 includes a first doped layer 20211, a passivation layer 20212, and a second doped layer 20213, and the protective region 2023 includes an insulation layer 20231 and a third doped layer 20232 having a same polarity as the second doped region 2022. That is to say, the first region specifically includes the first doped layer 20211, the passivation layer 20212, the second doped layer 20213, the insulation layer 20231, and the third doped layer 20232. A polarity of the third doped layer 20232 is opposite to that of the second doped layer 20213. The second region specifically includes the first doped layer 20211, the passivation layer 20212, and the second doped layer 20213. That is to say, the first region has the additional insulation layer 20231 and the additional third doped layer 20232 in the protective region 2023 than the second region. Further, an opening is provided in the protective region 2023, so that the first conductive layer extends through the opening to be connected to the first doped region 2021. That is to say that an opening extends through the insulation layer 20231 and the third doped layer 20232, so that the first conductive layer can pass through the opening to be connected to the second doped layer 20213. It needs to be noted that, as shown in FIG. 13, the opening is provided at middle positions of the insulation layer 20231 and the third doped layer 20232. Therefore, when the first conductive layer extends through the opening to be connected to the second doped layer 20213, the insulation layer 20231 and the third doped layer 20232 located at a periphery of the first conductive layer can form isolation and protection for the first conductive layer. Thus, as shown in FIG. 14 and FIG. 15, in a cell fabricated by using the back contact structure 2020 in this embodiment, since the protective region 2023 surrounds the first conductive layer, isolation is formed between an emitter in the cell and the first conductive layer arranged on a back surface field, so that a load in a space charge region is reduced. In addition, the protective region 2023 further blocks pollutants, thereby reducing a possibility of surface pollution. Moreover, the opening provided in the protective region 2023 may be used as an alignment reference during subsequent fabrication of the first conductive layer, so that the fabrication of the conductive layer is more accurate. In this embodiment, the third doped layer 20232 in the protective region 2023 is arranged at an outermost layer to achieve an anti-scratch effect, thereby preventing scratches on the first doped region 2021 on an inner side of the protective region 2023. In addition, since the protective region 2023 is arranged in the first doped region 2021 and no processing is performed on the second doped region 2022, the height of the second doped region 2022 is less than the height of the protective region 2023. Therefore, only the protective region 2023 comes into contact with the belt during the transmission, and a gap exists between the second doped region 2022 and the belt, so that suspension is achieved, thereby preventing scratching of the second doped region 2022 during the belt transmission.

Further, in an embodiment of the present invention, the isolation region 2024 is arranged between the first doped region 2021 and the second doped region 2022. The height of the first doped region 2021 and the height of the second doped region 2022 are both greater than the height of the isolation region 2024. It should be noted that the height is a distance from the front side of the silicon substrate 2010 to a corresponding structure. For example, the height of the first doped region 2021 is specifically a distance from the front side of the silicon substrate 2010 to the outermost third doped layer 20232 in the first doped region 2021, and the height of the isolation region 2024 is specifically a distance from the front side of the silicon substrate 2010 to the isolation region 2024. Specifically, in an embodiment of the present invention, the isolation region 2024 is a trench. The first doped region 2021 and the second doped region 2022 are arranged on the back side of the silicon substrate 2010, and the trench is provided in the back side of the silicon substrate 2010 toward inside thereof. Therefore, as shown in FIG. 14, the height of the isolation region 2024 is required to be less than the heights of the first doped region 2021 and the second doped region 2022. A height difference between the second doped region 2022 and the isolation region 2024 is in a range of 0.5-8 μm. By means of the trench provided between the first doped region 2021 and the second doped region 2022, the first doped region 2021 is separated from the second doped region 2022, thereby preventing an undesirable phenomenon such as electric leakage caused by the connection between the first doped region 2021 and the second doped region without barriers 2022. It needs to be noted that, a surface of the trench in contact with the silicon substrate 2010 may have a roughly textured structure arranged thereon. The roughly textured structure is usually formed by means of texturing, and includes but is not limited to an alkali polished surface, a mechanically polished surface, a random pyramid shape, an inverted pyramid shape, a spherical cap shape, a V-shaped groove, and a shape ranging among the above shapes. Generally, an irregular hemispherical texture may be formed by means of acid texturing, a pyramid-shaped texture may be formed by means of alkali texturing, or the pyramid-shaped texture may be formed first by means of alkali texturing and then a top of a pyramid is smoothened by means of acid texturing. In this way, a surface shape formed at the trench on the back side of the silicon substrate 2010 helps the silicon substrate 2010 absorb and reuse more light, so that a short-circuit current density is increased, thereby enhancing conversion efficiency of the solar cell.

Further, in other embodiments of the present invention, the isolation region 2024 may be a protrusion formed by a base of the silicon substrate 2010. In this case, grooves are spaced apart from each other on the back side of the silicon substrate 2010, and the first region and the second region are alternately arranged in each groove. The grooves may be formed by means of laser ablation or by using a combination of a mask (such as a hard mask, a silicon oxide mask, a silicon nitride mask, or a photoresist mask) and wet/dry etching. By means of the grooves spaced apart from each other on the back side of the silicon substrate 2010, a region between two adjacent grooves of the silicon substrate 2010 is substantially formed into a protrusion shape. Therefore, patterns on the back surface of the silicon substrate 2010 are generally formed by the grooves and the protrusions in a staggered arrangement, and the protrusion is used as the isolation region 2024 between the first doped region 2021 and the second doped region 2022. Since the height of the first doped region 2021 and the height of the second doped region 2022 are both greater than the height of the isolation region 2024, the second doped region 2022 and the outermost third doped layer 20232 in the first doped region 2021 protrudes from a surface of the protrusion on a top of the grooves. Therefore, the blocking between the first doped region 2021 and the second doped region 2022 arranged in the grooves can be realized by the protrusion structure between the grooves of the silicon substrate 2010. Correspondingly, it should be noted that the surface of the protrusion structure may also have a roughly textured structure arranged thereon. For details, refer to the above. Optionally, a trench may be further provided in the protrusion structure or the groove between the first doped region 2021 and the second doped region 2022, so that double isolation between the first doped region 2021 and the second doped region 2022 can be realized by the protrusion structure between the grooves of the silicon substrate 2010 and the trench structure.

Further, in an embodiment of the present invention, the groove is in a circular arc shape, a trapezoidal shape, or a square shape. The groove is preferably designed as the circular arc shape or the trapezoidal shape. When the groove is designed as the circular arc shape or the trapezoidal shape, inner walls of the groove can reflect light more effectively, and a surface area of the passivation layer 20212 in contact with the first doped layer 20211 can be increased. When the groove is designed as the square shape, an actual production process is much simpler. It needs to be further noted that, the grooves may have a same shape or different shapes. For example, the groove of the first doped region 2021 and the groove of the second doped region 2022 are both designed as the square shape, or the groove of the first doped region 2021 is designed as the square shape, and the groove of the second doped region 2022 is designed as the circular arc shape. The shapes of the grooves may be designed according to actual use requirements, and no specific limitation is imposed herein. Further, a width and a depth of each groove may be designed to be the same or different, and may be designed according to actual use requirements. No specific limitation is imposed herein.

Further, in an embodiment of the present invention, the height of the first doped region 2021 is greater than the height of the second doped region 2022. Specifically, by respectively controlling the film structures such as the first doped layers 20211, the passivation layers 20212, and the second doped layers 20213 in the first doped region 2021 and the second doped region 2022 to have different thicknesses, the height of the first doped region 2021 is greater than the height of the second doped region 2022. Certainly, alternatively, the grooves may be spaced apart from each other on the back side of the silicon substrate 2010, the first doped region 2021 is arranged outside the groove, and the second doped region 2022 is arranged inside the groove. In this way, the height of the first doped region 2021 is greater than the height of the second doped region 2022, as shown in FIG. 15. Preferably, a height difference between the first doped region 2021 and the second doped region 2022 is in a range of 1-8 μm. That is to say that in a case that film thicknesses of the first doped region 2021 and the second doped region 2022 are the same, a depth of the groove is preferably in a range of 1-8 μm. To realize the blocking between the first doped region 2021 and the second doped region 2022, a trench may be further provided between the first doped region 2021 and the second doped region 2022. The first doped region 2021 is separated from the second doped region 2022 by the trench. Alternatively, the first doped region 2021 may be arranged in a part of a region outside the groove, and the second doped region 2022 may be arranged in a part of a region inside the groove, so that the silicon substrates 2010 inside and outside the groove not covered by the first doped region 2021 and the second doped region 2022 realize the separation of the first doped region 2021 from the second doped region 2022. Further, a height difference between the second doped region 2022 the isolation region 2024 is in a range of 0.5-8 μm.

In an embodiment of the present invention, the passivation layers 20212 in the first doped region 2021 and the second doped region 2022 are preferably one or a combination of more than one of an oxide layer, a silicon carbide layer, or an amorphous silicon layer. In some examples of the present invention, the passivation layer 20212 may be an oxide layer made of a single material, a combination of an oxide layer and an amorphous silicon layer made of a plurality of materials, or a combination of a plurality of amorphous silicon layers having different refractive indexes made of a single material. In addition, the passivation layer 20212 may alternatively be a silicon oxynitride layer, a silicon nitride layer, or the like. It may be understood that the specific structure of the passivation layer 20212 includes but is not limited to the above. The passivation layer 20212 may be correspondingly designed according to actual use requirements, and no specific limitation is imposed herein. Further, a thickness of the passivation layer 20212 is in a range of 0.5-10 nm. In a preferable embodiment of the present invention, the thickness of the passivation layer 20212 is in a range of 0.8-2 nm. The thicknesses of the passivation layers 20212 in the first doped region 2021 and the second doped region 2022 may be designed as a thickness of a tunneling layer in the prior art or a thickness greater than the thickness of the conventional tunneling layer. The thicknesses may be designed according to actual use requirements, and no specific limitation is imposed herein.

In a preferable embodiment of the present invention, specifically, the passivation layer 20212 includes the oxide layer and the silicon carbide layer. The oxide layer and the silicon carbide layer are arranged in sequence from the silicon substrate 2010 toward the outside. The oxide layer is in contact with the first doped layer 20211 located on the inner side, and the silicon carbide layer is in contact with the second doped layer 20213 located on the outer side. Further, the oxide layer is preferably composed of one or more silicon oxide layers or an aluminum oxide layer. Therefore, the passivation layer 20212 may alternatively be a combination of the silicon oxide layer or the aluminum oxide layer in the oxide layer. The silicon carbide layer in the passivation layer 20212 includes a hydrogenated silicon carbide layer. Hydrogen in the hydrogenated silicon carbide layer enters the silicon substrate 2010 under an action of a diffusion mechanism and a thermal effect, so that a dangling bond for neutralizing the back side of the silicon substrate 2010 passivates defects of the silicon substrate 2010. Therefore, mitigating dangling bonds in a forbidden band increases a probability that a carrier enters the second doped layer 20213 through the passivation layer 20212.

Further, in an embodiment of the present invention, as shown in FIG. 13, the passivation layers 20212 in the first doped region 2021 and the second doped region 2022 each are a porous structure having the first doped layer 20211 and/or second doped layer 20213 in a hole region. The porous structure may be fabricated by means of additional chemical corrosion, dry etching, thermal diffusion impact, or the like. The porous structure is fabricated according to actual use requirements, and no specific limitation is imposed herein. It should be noted that, the porous structure is in a top view of the passivation layer 20212. In a cross-sectional view of the passivation layer 20212, the porous structure is presented as a multi-channel structure. The holes of the porous structure extend through the passivation layer 20212. Alternatively, grooves/notches not extending through the passivation layer 20212 are formed on a surface of the passivation layer 20212. A pore size of the porous structure is less than 20 μm. Specifically, an average pore size of the holes is less than 20 μm, or pore sizes of 90% of the holes are less than 20 μm. A ratio of an area of the hole region of the porous structure to an overall area of the porous structure is less than 20%, that is, the holes are sparsely distributed on the passivation layer 20212.

In an embodiment of the present invention, the hole region of the porous structure includes the first doped layer 20211 and/or the second doped layer 20213. That is to say, the hole region may include only the first doped layer 20211, or only the second doped layer 20213, or a mixture of the first doped layer 20211 and the second doped layer 20213. It needs to be noted that, in an actual production and fabrication process, a part of the hole region of the porous structure may include the first doped layer 20211 and/or the second doped layer 20213, and other parts not filled with the first doped layer 20211 and/or the second doped layer 20213 are gap regions. It needs to be further noted that, in addition to the first doped layer 20211 and/or the second doped layer 20213 filled in the hole region, impurities (such as hydrogen, oxygen, and various metal elements) formed or segregated in a thermal process (a plurality of high temperature procedures included in production of solar cells according to different processes) are allowed to exist in the hole region. At this time, since the passivation layer 20212 is designed as a porous structure, and the hole region has the first doped layer 20211 and/or the second doped layer 20213, a conductive channel is formed in the hole region of the passivation layer 20212, so that a desirable resistivity of the passivation layer 20212 is formed. In this way, the thickness of the passivation layer 20212 has less impact on a resistance, and control requirements for the thickness of the passivation layer 20212 are lowered. Thus, more methods are applicable to preparation of the passivation layer 20212 compared with the prior art. In addition, in the porous structure, the second doped layer 20213 is connected to the silicon substrate 2010 by the doped hole region and the first doped layer 20211, so that an overall resistance of the fabricated cell is further reduced, and the conversion efficiency of the cell is improved.

Further, in an embodiment of the present invention, a non-hole region of the porous structure includes a dopant having a same doping type as the first doped layer 20211 and/or the second doped layer 20213. Specifically, in this embodiment, when the first doped layer 20211 and the second doped layer 20213 in the first doped region 2021 are P-type doped layers (such as a boron doped layers), the non-hole region of the passivation layer 20212 in the first doped region 2021 includes a diffused P-type dopant. However, when the first doped layer 20211 and the second doped layer 20213 in the second doped region 2022 are N-type doped layers (such as a phosphorus doped layer), the non-hole region of the passivation layer 20212 in the second doped region 2022 includes a diffused N-type dopant.

In an embodiment of the present invention, the first doped layer 20211 is located between the silicon substrate 2010 and the passivation layer 20212. The first doped layer 20211 may be a doped layer directly deposited on the silicon substrate 2010 by means of ion implantation or the like. In this case, the first doped layer 20211 is located on the silicon substrate 2010. Correspondingly, the passivation layer 20212 is fabricated on the first doped layer 20211. The first doped layer 20211 may alternatively be a doped layer formed on the silicon substrate 2010 after a doped source of the second doped layer directly extends through the passivation layer 20212 or the holes in the porous structure during fabrication of the second doped layer 20213. In this case, the first doped layer 20211 is located in the silicon substrate 2010. Correspondingly, the passivation layer 20212 is directly fabricated on the silicon substrate 2010. Therefore, during the fabrication of the second doped layer 20213, the doped source of the second doped layer is thermally diffused into the silicon substrate 2010, so that a part of the silicon substrate 2010 is diffused into the first doped layer 20211. A doping concentration of the first doped layer 20211 is between a doping concentration of the silicon substrate 2010 and a doping concentration of the second doped layer 20213. In a preferred embodiment of the present invention, the first doped layer 20211 and the second doped layer 20213 have a same doping polarity. For example, when the second doped layer 20213 in the first doped region 2021 is a P-type doped layer, the first doped layer 20211 in the first doped region 2021 is correspondingly preferably a P-type doped layer. When the second doped layer 20213 in the second doped region 2022 is an N-type doped layer, the first doped layer 20211 in the second doped region 2022 is correspondingly preferably an N-type doped layer. The doping polarities of the first doped layer 20211 and the second doped layer 20213 in the first doped region 2021 are opposite to the doping polarity of the silicon substrate 2010.

Preferably, a material of the first doped layer 20211 is preferably designed to be the same as a material of the silicon substrate 2010. That is to say that when the silicon substrate 2010 is a monocrystalline silicon wafer, the first doped layer 20211 is also preferably designed as the monocrystalline silicon wafer. The first doped layer 20211 is a monocrystalline silicon doped layer doped with a group-III or group-V element. When the second doped layer 20213 is the N-type doped layer, the first doped layer 20211 is a monocrystalline silicon doped layer doped with group-V elements such as nitrogen, phosphorus, and arsenic. When the second doped layer 20213 is the P-type doped layer, the first doped layer 20211 is a monocrystalline silicon doped layer doped with group-III elements such as boron, aluminum, and gallium. It may be understood that, when the silicon substrate 2010 is designed as silicon wafers of other types, the first doped layer 20211 may be correspondingly designed as doped silicon wafers of other types doped with a group-III or group-V element.

Further, in an embodiment of the present invention, the first doped layer 20211 is in a discrete or continuous distribution. The first doped layer may be completely continuously arranged between the silicon substrate 2010 and the passivation layer 20212, or may be partly discretely distributed near the hole regions of the passivation layer 20212. The distribution of the first doped layer 20211 may be controlled by using a doping process. A longer doping time leads to a larger doping amount, and thereby leads to a larger continuity ratio of the first doped layer 20211, until the first doped layer 20211 completely covering the silicon substrate 2010 is formed thereon. Further, a junction depth of the first doped layer 20211 is less than 1.5 μm. Since the first doped layer 20211 is arranged between the silicon substrate 2010 and the passivation layer 20212 to form a separation electric field capable of enhancing surface electron holes, a field passivation effect is enhanced. In addition, since a Fermi level of the first doped layer 20211 is changed, a solid concentration of transition metal is increased, so that impurity gettering is enhanced, thereby achieving an additional impurity gettering effect.

In an embodiment of the present invention, the second doped layer 20213 includes a polysilicon doped layer, a silicon carbide doped layer, or an amorphous silicon doped layer. The silicon carbide doped layer in the second doped layer 20213 is composed of at least one silicon carbide doped film each having a different refractive index. The refractive indexes of the silicon carbide doped films sequentially decrease along a direction from the silicon substrate 2010 to the outside. It needs to be noted that, thicknesses and the refractive indexes of the silicon carbide doped films may be designed according to actual use requirements, provided that the refractive indexes sequentially decrease along the direction from the silicon substrate 2010 to the outside. No specific limitation is imposed herein. Since silicon carbide has a wide optical band gap and a low absorption coefficient, parasitic absorption can be reduced, and a short-circuit current density can be effectively increased. Further, the silicon carbide doped layer in the second doped layer 20213 includes a hydrogenated silicon carbide doped layer. A conductivity of the hydrogenated silicon carbide doped layer is greater than 0.01 S·cm, and a thickness of the hydrogenated silicon carbide doped layer is greater than 10 nm. Correspondingly, the conductivity and the thickness may be set to other values, provided that a requirement for the conductivity of the second doped layer 20213 can be met by controlling the conductivity and the thickness of the hydrogenated silicon carbide doped layer. No specific limitation is imposed herein. It needs to be noted that, the first doped layer 20211 and the second doped layer 20213 may be made of a same material or different materials. For example, the first doped layer 20211 and the second doped layer 20213 are both made of doped polysilicon. Alternatively, for example, the first doped layer 20211 may be made of doped monocrystalline silicon, and the second doped layer 20213 may be made of doped silicon carbide. The first doped layer and the second doped layer may be designed according to actual use requirements, and no specific limitation is imposed herein.

It should be noted that, since each of the first doped region 2021 and the second doped region 2022 includes the first doped layer 20211, the passivation layer 20212, and the second doped layer 20213, a material and a thickness of each structure in the first doped region 2021 may be the same as or different from those of each structure in the second doped region 2022. For example, when a material of the passivation layer 20212 in the first doped region 2021 is specifically a silicon oxide layer and a silicon carbide layer, a material of the passivation layer 20212 in the second doped region 2022 may be the same as the material of the passivation layer 20212 in the first doped region 2021, or may be different from the material of the passivation layer 20212 in the first doped region 2021, such as an aluminum oxide layer and a silicon carbide layer.

The thickness of the passivation layer 20212 in the first doped region 2021 may be designed to be the same as or different from the thickness of the passivation layer 20212 in the second doped region 2022. Preferably, regardless of whether the material of the passivation layer 20212 in the first doped region 2021 is the same as the material of the passivation layer 20212 in the second doped region 2022, the thickness of the passivation layer 20212 corresponding to the first doped layer 20211 doped with the group-III element is designed to be larger, and the thickness of the passivation layer 20212 corresponding to the first doped layer 20211 doped with the group-V element is designed to be smaller. When one of the first doped region 2021 and the second doped region 2022 is the P-type doped region, and the other of the first doped region and the second doped region is the N-type doped region, the thickness of the passivation layer 20212 in the P-type doped region is greater than the thickness of the passivation layer 20212 in the N-type doped region. Specifically, in this embodiment, the thickness of the passivation layer 20212 in the first doped region 2021 is greater than the thickness of the passivation layer 20212 in the second doped region 2022. Correspondingly, when the silicon substrate 2010 is a P-type silicon wafer, the thickness of the passivation layer 20212 in the second doped region 2022 is greater than the thickness of the passivation layer 20212 in the first doped region 2021. A main reason lies in that the P-type doped region requires a process such as boron doping, a higher temperature, and a plurality of times of heat processing. Therefore, a thicker passivation layer 20212 is required. In this embodiment, the material and the thickness of each structure in the first doped region 2021 and in the second doped region 2022 are correspondingly designed according to actual use requirements, and no specific limitation is imposed herein.

In addition, in a preferred embodiment of the present invention, a hole density of the passivation layer 20212 in the P-type doped region is greater than a hole density of the passivation layer 20212 in the N-type doped region. The hole density means a quantity of holes per unit area. That is to say that in a same unit area, the passivation layer 20212 in the P-type doped region has more holes than the passivation layer 20212 in the N-type doped region. A main reason lies in that conductivity of the P-type doped region is relatively poor, and the thickness of the passivation layer 20212 in the P-type doped region is relatively large. Therefore, more holes are required to enhance the conductivity. Specifically, in this embodiment, the hole density of the passivation layer 20212 in the first doped region 2021 is greater than the hole density of the passivation layer 20212 in the second doped region 2022.

In an embodiment of the present invention, for details of the insulation layer 20231 in the protective region 2023, refer to the above description of the passivation layer 20212. That is to say that the insulation layer 20231 is an oxide layer, a silicon carbide layer, an amorphous silicon layer, or a combination thereof. Specifically, the insulation layer 20231 preferably includes the oxide layer and the silicon carbide layer. The oxide layer and the silicon carbide layer are arranged in sequence from the silicon substrate 2010 toward the outside. The oxide layer is in contact with the second doped layer 20213 on the inner side, and the silicon carbide layer is in contact with the third doped layer 20232 on the outer side. The silicon carbide layer in the insulation layer 20231 includes a hydrogenated silicon carbide layer. It needs to be noted that, the insulation layer 20231 is not the above porous structure. It needs to be further noted that, film structures in the passivation layer 20212 and the insulation layer 20231 may be designed to be the same or different. Thus, the passivation layer 20212 and/or the insulation layer 20231 are/is one or a combination of more than one of the oxide layer, the silicon carbide layer, or the amorphous silicon layer. For example, the passivation layer 20212 and the insulation layer 20231 both include the silicon oxide layer and the silicon carbide layer. In another example, the passivation layer 20212 includes the silicon oxide layer and the silicon carbide layer, and the insulation layer 20231 includes the aluminum oxide layer and the silicon carbide layer. The passivation layer 20212 and the insulation layer 20231 may be respectively designed according to actual use requirements, and no specific limitation is imposed herein. Further, in this embodiment, a thickness of the insulation layer 20231 is in a range of 5-150 nm. Preferably, the thickness of the insulation layer 20231 is greater than the thickness of the passivation layer 20212. The insulation layer 20231 may also include a dopant having the same doping type as the second doped layer 20213 and/or the third doped layer 20232.

In an embodiment of the present invention, for details of the third doped layer 20232 in the protective region 2023, refer to the above description of the second doped layer 20213. That is to say, the third doped layer 20232 includes a polysilicon doped layer, a silicon carbide doped layer, or an amorphous silicon doped layer. The silicon carbide doped layer in the third doped layer 20232 is composed of at least one silicon carbide doped film each having a different refractive index. The refractive indexes of the silicon carbide doped films sequentially decrease along the direction from the silicon substrate 2010 to the outside. The silicon carbide doped layer in the third doped layer 20232 includes a hydrogenated silicon carbide doped layer. A conductivity of the hydrogenated silicon carbide doped layer is greater than 0.01 S·cm, and a thickness of the hydrogenated silicon carbide doped layer is greater than 10 nm. Since hydrogen included in the second doped layer 20213 and the third doped layer 20232 can diffuse inward in a high-temperature process, hydrogen passivation is enhanced. It needs to be noted that, the second doped layer 20213 and the third doped layer 20232 may have a same material or different materials. Therefore, the second doped layer 20213 and/or the third doped layer 20232 include(s) the polysilicon doped layer, the silicon carbide doped layer, or the amorphous silicon doped layer. It needs to be further noted that the doping polarity of the second doped layer 20213 in the first doped region 2021 is opposite to the doping polarity of the third doped layer 20232 in the protective region 2023. For example, in this embodiment, the second doped layer 20213 in the first doped region 2021 is a P-type doped layer, and the third doped layer 20232 in the protective region 2023 is an N-type doped layer. A Fermi level of the third doped layer 20232 is changed, which increases an interface defect, so that heterogeneous nucleation points can be formed on the interface defect to enhance the impurity gettering effect. In this way, an additional impurity gettering effect is achieved.

In an embodiment of the present invention, during fabrication of the back contact structure 2020, the first doped region 2021 may be first fabricated on the back side of the silicon substrate 2010 first. Referring to the above, the passivation layer 20212 in the first doped region 2021 is fabricated first, then the porous structure is formed on the passivation layer 20212 by additional chemical etching, dry etching, or thermal diffusion impact, or the like, and then the second doped layer 20213 is fabricated in the first doped region 2021. Specifically, for example, intrinsic amorphous silicon is deposited on the passivation layer 20212, then a P-type doped source including boron, aluminum, gallium, and the like is deposited on the intrinsic amorphous silicon or P-type ions including elements such as boron, aluminum, and gallium are implanted into the intrinsic amorphous silicon, and then high-temperature crystallization is performed to transform the original intrinsic amorphous silicon into P-type doped polysilicon. During the high temperature crystallization, the doped source directly extends through the passivation layer 20212 or extends through the holes in the porous structure to form the first doped layer 20211 in the silicon substrate 2010, thereby fabricating the first doped region 2021 on the entire back side of the silicon substrate 2010. Then, patterned etching (such as mask processing) is performed at a position where the second doped region 2022 is to be fabricated, to remove the first doped region 2021 at the position where the second doped region 2022 is to be fabricated to expose the silicon substrate 2010. Further, the second doped region 2022 is fabricated on the entire back side of the silicon substrate 2010. For a fabrication process thereof, refer to the above. Since the passivation layer 20212 and the second doped layer 20213 in the second doped region 2022 and the insulation layer 20231 and the third doped layer 20232 in the protective region 2023 have similar structures and may be made of a same material, and the second doped layer 20213 in the second doped region 2022 has the same doping polarity as the third doped layer 20232 in the protective region 2023, the second doped region 2022 and the protective region 2023 may be fabricated simultaneously by reusing the same process. However, it needs to be noted that, since the porous structure is not required to be fabricated for the insulation layer 20231 by additional chemical etching, dry etching, the thermal diffusion impact, or the like during the fabrication by deposition, and a deposition time of the insulation layer 20231 is longer than a deposition time of the passivation layer 20212 in the second doped region 2022, the thickness of the insulation layer 20231 is greater than the thickness of the passivation layer 20212 in the second doped region 2022. In this case, the protective region 2023 is an intermediate generated in the production process of the second doped region 2022. The protective region is locally reserved by a patterned design, so that no additional process is required for generating the protective region, thereby reducing processes, a process time, and process costs.

In this embodiment, the protective region is arranged on the first doped region and no processing is performed on the second doped region. In this way, the third doped layer in the protective region is arranged on the outermost layer to provide an anti-scratch effect, thereby preventing scratching of the first doped region on the inner side of the protective region. In addition, since the height of the second doped region is less than the height of the protective region, only the protective region comes into contact with the belt during transmission, and a gap exists between the second doped region and the belt, so that suspension is achieved, thereby preventing scratching of the second doped region during the belt transmission. Therefore, scratches caused by the belt to the first doped region and the second doped region during the belt transmission are avoided. In this way, the scratches caused by the belt transmission in an existing cell fabrication process are resolved.

Since the passivation layer and the second doped layer in the second doped region and the insulation layer and the third doped layer in the protective region have similar structures and may be made of same materials, and the second doped layer in the second doped region has the same doping polarity as the third doped layer in the protective region, the second doped region and the protective region may be fabricated simultaneously by reusing the same process. Therefore, the protective region may be used as an intermediate generated in the fabrication process of the second doped region. The protective region is locally reserved by a patterned design, so that no additional process is required for generating the protective region, thereby reducing processes, a process time, and process costs. In addition, the opening is provided in the protective region, the first conductive layer is connected to the first doped region through the opening, and the first conductive layer is arranged on the first doped region. Therefore, the first doped region located at a periphery of the first conductive layer can form isolation and protection for the first conductive layer, thereby forming isolation between an emitter and the first conductive layer arranged on a back surface field in the cell fabricated by using the back contact structure. In this way, an isolation effect is enhanced, and recombination in a space-charge region is reduced. The protective region further blocks pollutants, thereby reducing a possibility of surface pollution. Moreover, the opening provided in the protective region may be used as an alignment reference during subsequent fabrication of the first conductive layer, so that the fabrication of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. In addition, since the isolation region is arranged between the first doped region and the second doped region, isolation between the first doped region and the second doped region can be realized, thereby preventing an undesirable phenomenon such as electric leakage caused by the connection between the first doped region and the second doped region without barriers. Since the passivation layer is designed as a porous structure, and the hole region has the first doped layer and/or the second doped layer embedded therein, a conductive channel is formed in the hole region of the passivation layer, so that a desirable resistivity of the passivation layer is formed. Therefore, the thickness of the passivation layer has less impact on a resistance. In this way, control requirements for the thickness of the passivation layer are lowered, and the method for fabricating a passivation layer is more flexible than the prior art. The first doped layer is arranged between the silicon substrate and the passivation layer to form a separation electric field capable of enhancing surface electron holes, so that the field passivation effect is enhanced. In addition, hydrogen included in the second doped layer and the third doped layer can diffuse inward in a high-temperature process, so that hydrogen passivation is enhanced.

Example 9

A ninth embodiment of the present invention provides a solar cell. For ease of description, only parts related to this embodiment of the present invention are shown. Referring to FIG. 14 and FIG. 15, the solar cell provided in this embodiment of the present invention includes:

a silicon substrate 2010;

the back contact structure 2020 described in the above embodiments, arranged on a back side of the silicon substrate 2010;

a first dielectric layer 2030, arranged on a front side of the silicon substrate 2010;

a first conductive layer 2040 arranged in the first doped region 2021 of the back contact structure 2020 and a second conductive layer 2050 arranged in the second doped region 2022 of the back contact structure 2020; and a second dielectric layer 2060, arranged on the back contact structure 2020 and between the first conductive layer 2040 and the second conductive layer 2050.

In an embodiment of the present invention, the first dielectric layer 2030 and the second dielectric layer 2060 each are an aluminum oxide layer, a silicon nitride layer, a silicon oxynitride layer, a silicon carbide layer, an amorphous silicon layer, a silicon oxide layer, or a combination thereof. The first dielectric layer 2030 and the second dielectric layer 2060 achieve a passivation effect. The first dielectric layer 2030 and the second dielectric layer 2060 each are designed as a structure having at least one layer. Refractive indexes of all layers sequentially decrease along the direction from the silicon substrate 2010 to the outside, so that a film layer close to the silicon substrate 2010 achieves the passivation effect, and a film layer away from the silicon substrate 2010 achieves an antireflection effect. In this way, an anti-reflection effect is enhanced, so that the silicon substrate 2010 absorbs and uses more light, and a short-circuit current density is increased. The film layers in the first dielectric layer 2030 and in the second dielectric layer having different structures may be composed of a plurality of films each having a different refractive index. According to the above description that the film layers are arranged in such a way that the refractive indexes of the film layers sequentially decrease along the direction from the silicon substrate 2010 to the outside, the silicon oxide layers in the first dielectric layer 2030 may be composed of a plurality of silicon oxide films having refractive indexes sequentially decreasing along the direction from the silicon substrate 2010 to the outside, for example.

It should be noted that, the first dielectric layer 2030 and the second dielectric layer 2060 may have a same structural arrangement or different structural arrangements. The film structures in the first dielectric layer 2030 and in the second dielectric layer 2060 may be correspondingly designed according to actual use requirements, and no limitation is imposed herein. Preferably, the first dielectric layer 2030 and the second dielectric layer 2060 are designed to be the same. Therefore, the first dielectric layer 2030 and the second dielectric layer 2060 may be fabricated on the front side and the back side of the silicon substrate 2010 respectively by using a same process.

In a preferred embodiment of the present invention, the first dielectric layer 2030 and/or the second dielectric layer 2060 preferably include(s) a double-layer structure having an aluminum oxide layer and a silicon carbide layer or a double-layer structure having a silicon oxide layer and a silicon carbide layer. In this case, an overall thickness of the first dielectric layer 2030 is greater than 2050 nm, and an overall thickness of the second dielectric layer 2060 is greater than 25 nm. It may be understood that the specific structural arrangements of the first dielectric layer 2030 and the second dielectric layer 2060 include but are not limited to the specific examples listed above.

Further, in an embodiment of the present invention, a thickness of the aluminum oxide layer or the silicon oxide layer in the first dielectric layer 2030 is less than 40 nm. A thickness of the aluminum oxide layer or the silicon oxide layer in the second dielectric layer 2060 is less than 25 nm. A thickness of the silicon carbide layer in the first dielectric layer 2030 and/or in the second dielectric layer 2060 is greater than 10 nm. The silicon carbide layer in the first dielectric layer 2030 and/or in the second dielectric layer 2060 not only provides a hydrogen passivation effect, but also reduces parasitic light absorption by virtue of a large optical band gap and a small absorption coefficient.

It needs to be noted that, all of the multi-layer structures in this embodiment of the present invention conform to an arrangement sequence from the silicon substrate 2010 toward the outside. For example, when the above first dielectric layer 2030 includes the aluminum oxide layer and the silicon carbide layer, the aluminum oxide layer is close to the silicon substrate 2010, and the silicon carbide layer is close to the outside. It needs to be further noted that, in the drawings, FIG. 14 and FIG. 15 only show the first dielectric layer 2030 and the second dielectric layer 2060 having double-layer structures. However, it may be understood that the first dielectric layer 2030 and the second dielectric layer 2060 may include other quantities of layers. Respective specific structures may be designed according to actual requirements, and are unnecessarily completely same as those in the drawings. It needs to be further noted that, each drawing of the present invention is merely used for describing the specific structural distribution of the solar cell, and does not represent an actual size of each corresponding structure. The drawings do not completely correspond to specific actual sizes in this embodiment, and the actual size of each structure needs to conform to specific parameters provided in this embodiment.

Further, the silicon carbide layer in the first dielectric layer 2030 and/or in the second dielectric layer 2060 is composed of at least one silicon carbide film each having a different refractive index. The refractive indexes of the silicon carbide films sequentially decrease along the direction from the silicon substrate 2010 to the outside. Optionally, the refractive indexes of all of the materials may be generally as follows: the refractive index of monocrystalline silicon is 3.88, the refractive index of amorphous silicon is in a range of 3.5-4.2, the refractive index of polysilicon is 3.93, the refractive index of silicon carbide is in a range of 2-3.88, the refractive index of silicon nitride is in a range of 1.9-3.88, the refractive index of silicon oxynitride is in a range of 1.45-3.88, the refractive index of silicon oxide is 1.45, and the refractive index of aluminum oxide is 1.63. It may be understood that the refractive indexes of the above materials may be set to other values according to actual use requirements, and no specific limitation is imposed herein.

Further, in an embodiment of the present invention, a magnesium fluoride layer is further arranged on an outer layer of the first dielectric layer 2030 and/or the second dielectric layer 2060. That is to say, in addition to one or a combination of more than one of the aluminum oxide layer, the silicon nitride layer, the silicon oxynitride layer, the silicon carbide layer, the amorphous silicon layer, or the silicon oxide layer used in the first dielectric layer 2030 and the second dielectric layer 2060, a magnesium fluoride layer may be further arranged on the outer layer of the first dielectric layer 2030 and/or the second dielectric layer 2060. The magnesium fluoride layer is required to have a minimum refractive index. Generally, the refractive index is set to 1.4. The magnesium fluoride layer has an optical effect of enhancing antireflection.

Further, in an embodiment of the present invention, an electric field layer or a floating junction is further arranged between the front side of the silicon substrate 2010 and the first dielectric layer 2030. Specifically, phosphorus diffusion is performed on the silicon substrate 2010 to fabricate the electric field layer, or boron diffusion is performed to fabricate the floating junction. The electric field layer or the floating junction is used as a front surface electric field of the solar cell.

Further, in an embodiment of the present invention, a texturing process is further performed before the first dielectric layer 2030 is fabricated on the front side of the silicon substrate 2010. A shape formed on the front side includes but is not limited to an alkali polished surface, a mechanically polished surface, a random pyramid shape, an inverted pyramid shape, a spherical cap shape, a V-shaped groove, and a shape ranging among the above shapes. The surface shape formed on the front side of the silicon substrate 2010 helps reduce reflection of sunlight on the front side, thereby improving conversion efficiency of the solar cell.

In an embodiment of the present invention, the first conductive layer 2040 and/or the second conductive layer 2050 are/is transparent conductive oxide (TCO) films and/or metal electrodes. The metal electrodes include a silver electrode, a copper electrode, an aluminum electrode, a tin-coated copper electrode, or a silver-coated copper electrode. Further, the copper electrode is electroplated copper fabricated by using an electroplating process or a copper electrode fabricated by means of physical vapor deposition. A nickel electrode, a chromium electrode, a titanium electrode, or a tungsten electrode is used as a seed layer or a protective layer of the electroplated copper. It needs to be noted that, the first conductive layer 2040 and the second conductive layer 2050 may be a same electrode or different electrodes. For example, the first conductive layer 2040 and the second conductive layer 2050 are both the aluminum electrode. Alternatively, for example, the first conductive layer 2040 is the silver electrode, and the second conductive layer 2050 is the aluminum electrode.

Further, in an embodiment of the present invention, the first conductive layer 2040 is arranged in the first doped region 2021 and in an opening provided in the protective region 2023, and the second conductive layer 2050 is arranged in the second doped region 2022. The second dielectric layer 2060 is arranged on the back contact structure 2020, and is arranged between the first conductive layer 2040 and the second conductive layer 2050. Correspondingly, the second dielectric layer 2060 is arranged on an outermost side of the back side of the entire silicon substrate 2010 other than the first conductive layer 2040 and the second conductive layer 2050, as shown in FIG. 14 and FIG. 15. When the isolation region 2024 is a trench, the second dielectric layer 2060 covers the trench. Correspondingly, during fabrication, the second dielectric layer 2060 may be caused to completely cover the entire back side of the silicon substrate 2010, and then the first conductive layer 2040 extends through the second dielectric layer 2060 through holes to be electrically connected to the first doped region 2021. The second conductive layer 2050 extends through the second dielectric layer 2060 through holes to be electrically connected to the second doped region 2022. Conductive polarities of the first conductive layer 2040 and the second conductive layer 2050 are determined according to the polarities of the first doped region 2021 and the second doped region 2022. No specific limitation is imposed herein.

In this embodiment, the protective region is arranged on the first doped region and no processing is performed on the second doped region. In this way, the third doped layer in the protective region is arranged on the outermost layer to provide an anti-scratch effect, thereby preventing scratching of the first doped region on the inner side of the protective region. In addition, since the height of the second doped region is less than the height of the protective region, only the protective region comes into contact with the belt during transmission, and a gap exists between the second doped region and the belt, so that suspension is achieved, thereby preventing scratching of the second doped region during the belt transmission. Therefore, scratches caused by the belt to the first doped region and the second doped region during the belt transmission are avoided. In this way, the scratches caused by the belt transmission in an existing cell fabrication process are resolved.

Since the passivation layer and the second doped layer in the second doped region and the insulation layer and the third doped layer in the protective region have similar structures and may be made of same materials, and the second doped layer in the second doped region has the same doping polarity as the third doped layer in the protective region, the second doped region and the protective region may be fabricated simultaneously by reusing the same process. Therefore, the protective region may be used as an intermediate generated in the fabrication process of the second doped region. The protective region is locally reserved by a patterned design, so that no additional process is required for generating the protective region, thereby reducing processes, a process time, and process costs. In addition, the opening is provided in the protective region, the first conductive layer is connected to the first doped region through the opening, and the first conductive layer is arranged on the first doped region. Therefore, the first doped region located at a periphery of the first conductive layer can form isolation and protection for the first conductive layer, thereby forming isolation between an emitter and the first conductive layer arranged on a back surface field in the cell fabricated by using the back contact structure. In this way, an isolation effect is enhanced, and recombination in a space-charge region is reduced. The protective region further blocks pollutants, thereby reducing a possibility of surface pollution. Moreover, the opening provided in the protective region may be used as an alignment reference during subsequent fabrication of the first conductive layer, so that the fabrication of the conductive layer is more accurate. Since a Fermi level of the first doped layer is changed, a solid concentration of transition metal is increased, enhancing the impurity gettering. A Fermi level of the third doped layer is changed, which increases an interface defect, so that heterogeneous nucleation points can be formed on the interface defect to enhance the impurity gettering effect. In this way, an additional impurity gettering effect is achieved. In addition, since the isolation region is arranged between the first doped region and the second doped region, isolation between the first doped region and the second doped region can be realized, thereby preventing an undesirable phenomenon such as electric leakage caused by the connection between the first doped region and the second doped region without barriers. Since the passivation layer is designed as a porous structure, and the hole region has the first doped layer and/or the second doped layer embedded therein, a conductive channel is formed in the hole region of the passivation layer, so that a desirable resistivity of the passivation layer is formed. Therefore, the thickness of the passivation layer has less impact on a resistance. In this way, control requirements for the thickness of the passivation layer are lowered, and the method for fabricating a passivation layer is more flexible than the prior art. The first doped layer is arranged between the silicon substrate and the passivation layer to form a separation electric field capable of enhancing surface electron holes, so that the field passivation effect is enhanced. In addition, hydrogen included in the second doped layer and the third doped layer can diffuse inward in a high-temperature process, so that hydrogen passivation is enhanced.

Example 10

A tenth embodiment of the present invention further provides a photovoltaic module. The photovoltaic module includes the solar cell described in Example 10.

Example 11

An eleventh embodiment of the present invention further provides a photovoltaic system. The photovoltaic system includes the photovoltaic module described in Example 11.

It will be obvious to those skilled in the art that changes and modifications may be made, and therefore, the aim in the appended claims is to cover all such changes and modifications.

What is claimed is:

1. A solar cell, comprising:

a silicon substrate;

a first doped region and a second doped region, spaced apart on a back side of the silicon substrate and having opposite polarities;

a first conductive layer and a second conductive layer, respectively disposed in the first doped region and the second doped region;

wherein the first doped region comprises a first doped layer, a first passivation layer, a second doped layer, a second passivation layer and a third doped layer disposed on the silicon substrate in sequence, and a through opening is provided on the second passivation layer and the third doped layer so that the first conductive layer connects to the second doped layer; and the second doped region comprises a fourth doped layer, a third passivation layer, a fifth doped layer disposed on the silicon substrate in sequence.

2. The solar cell according to claim 1, wherein the first passivation layer is a porous structure comprising a hole region, the first doped layer and/or the second doped layer being disposed in the hole region, and/or wherein the third passivation layer is a porous structure having a hole region, and/or wherein a thickness of the second passivation layer is greater than a thickness of the third passivation layer, and/or wherein the fourth doped layer is formed in the silicon substrate, and/or wherein the first doped layer is doped with a group-III element and the fourth doped layer is doped with a group-V element, the fourth doped layer preferably being a monocrystalline silicon doped layer.

3. The solar cell according to claim 1, wherein grooves spaced apart are provided on the back side of the silicon substrate, and the first doped region and the second doped region are alternately disposed in the grooves.

4. The solar cell according to claim 1, wherein grooves spaced apart are provided on the back side of the silicon substrate; one of the first doped region and the second doped region is disposed in one of the grooves, and the other of the first doped region and the second doped region is disposed outside the grooves.

5. The solar cell according to claim 2, wherein a trench is provided between the first doped region and the second doped region.

6. The solar cell according to claim 4, wherein the first doped region and the second doped region are disposed in a part of regions inside and outside the grooves.

7. The solar cell according to claim 1, wherein the first dielectric layer and the second dielectric layer each are an aluminum oxide layer, a silicon nitride layer, a silicon oxynitride layer, a silicon carbide layer, an amorphous silicon layer, a silicon oxide layer, or a combination thereof.

8. The solar cell according to claim 7, wherein the first dielectric layer and/or the second dielectric layer comprise(s) the aluminum oxide layer and the silicon carbide layer, or the silicon oxide layer and silicon carbide layer; and a thickness of the first dielectric layer is greater than 50 nm, and a thickness of the second dielectric layer is greater than 25 nm.

9. The solar cell according to claim 8, wherein a thickness of the aluminum oxide layer or the silicon oxide layer in the first dielectric layer is less than 40 nm, a thickness of the aluminum oxide layer or the silicon oxide layer in the second dielectric layer is less than 25 nm, and a thickness of the silicon carbide layer in the first dielectric layer and/or in the second dielectric layer is greater than 10 nm.

10. The solar cell according to claim 7, wherein the silicon carbide layer in the first dielectric layer and/or in the second dielectric layer comprises at least one silicon carbide film; and refractive indexes of the at least one silicon carbide films decrease from the silicon substrate toward outside.

11. The solar cell according to claim 7, wherein a magnesium fluoride layer is disposed outside the first dielectric layer and/or the second dielectric layer.

12. The solar cell according to claim 1, wherein the first conductive layer and the second conductive layer are transparent conductive oxide layer (TCO) transparent conductive films and/or metal electrodes.

13. The solar cell according to claim 12, wherein the metal electrodes each comprises a silver electrode, a copper electrode, an aluminum electrode, a tin-coated copper electrode, or a silver-coated copper electrode.

14. The solar cell according to claim 1, wherein an electric field layer or a floating junction is disposed between the front side of the silicon substrate and the second dielectric layer.

15. The solar cell according to claim 1, wherein a hole density of the first passivation layer is greater than a hole density of the third passivation layer.

16. A cell assembly, comprising the solar cell according to claim 1.

17. A photovoltaic system, comprising the cell assembly according to claim 16.

* * * * *